(12) United States Patent
Ng et al.

(10) Patent No.: US 10,565,487 B2
(45) Date of Patent: Feb. 18, 2020

(54) INTEGRATED CIRCUIT MODULES AND SMART CARDS INCORPORATING THE SAME

(71) Applicant: SMARTFLEX TECHNOLOGY PTE LTD, Singapore (SG)

(72) Inventors: Eng Seng Ng, Singapore (SG); Sze Yong Pang, Singapore (SG); Cheng Kim Heng, Singapore (SG)

(73) Assignee: SMARTFLEX TECHNOLOGY PTE LTD, Singapore (SG)

( * ) Notice: Subject to any disclaimer, the term of this patent is extended or adjusted under 35 U.S.C. 154(b) by 0 days.

(21) Appl. No.: 16/082,253

(22) PCT Filed: Feb. 15, 2018

(86) PCT No.: PCT/SG2018/050074
§ 371 (c)(1),
(2) Date: Sep. 4, 2018

(87) PCT Pub. No.: WO2019/045642
PCT Pub. Date: Mar. 7, 2019

(65) Prior Publication Data
US 2019/0294943 A1 Sep. 26, 2019

(30) Foreign Application Priority Data
Aug. 28, 2017 (WO) ................ PCT/SG2017/050423

(51) Int. Cl.
*G06K 19/06* (2006.01)
*G06K 19/07* (2006.01)
*G06K 19/077* (2006.01)

(52) U.S. Cl.
CPC ... *G06K 19/0723* (2013.01); *G06K 19/07754* (2013.01); *G06K 19/07769* (2013.01);
(Continued)

(58) Field of Classification Search
CPC . H01L 2924/00014; H01L 2224/48227; H01L 2924/181; H01L 2224/48228; H01L 2223/6611; H01L 2224/04042; H01L 2224/08111; H01L 2224/73265; H01L 24/08; H01L 24/48; H01L 24/49; G06K 19/07769; G06K 19/0775; H05K 1/112
See application file for complete search history.

(56) References Cited

U.S. PATENT DOCUMENTS 6,568,600 B1 * 5/2003 Carpier ............ G06K 19/07749
235/487
9,390,365 B2 7/2016 Ziemkus
(Continued)

FOREIGN PATENT DOCUMENTS

CN 205845082 12/2016
CN 205845082 * 7/2017
(Continued)

*Primary Examiner* — Thien M Le
(74) *Attorney, Agent, or Firm* — Cuenot, Forsythe & Kim, LLC; Stanley A. Kim

(57) ABSTRACT

Embodiments of the invention provide an integrated chip (IC) module having contact pads which are accessible by single-bond holes and module-side antenna contact pads which are accessible by multi-bond holes. Each multi-bond hole is apportioned by an encapsulation into adjoining bonding channels for separately receiving wire bond(s) and antenna-connecting element. Each module-side antenna contact pad is apportioned by the encapsulation into adjoining but electrically connected bonding areas to allow establishment of electrical connection of both wire bond(s) and antenna-connecting element to an IC chip. The first and the second bonding area are partitioned from each other, by the encapsulant, without requiring a presence of substrate therebetween.

51 Claims, 14 Drawing Sheets

(52) U.S. Cl.
CPC ............... *H01L 2224/05554* (2013.01); *H01L 2224/48091* (2013.01); *H01L 2224/48111* (2013.01); *H01L 2224/48228* (2013.01); *H01L 2224/48465* (2013.01); *H01L 2224/49113* (2013.01); *H01L 2224/49171* (2013.01); *H01L 2224/73265* (2013.01)

(56) References Cited

U.S. PATENT DOCUMENTS

| | | | |
|---|---|---|---|
| 2015/0235122 A1* | 8/2015 | Finn | G06K 19/07794 235/439 |
| 2015/0269471 A1* | 9/2015 | Finn | H05K 3/46 235/492 |
| 2015/0269472 A1* | 9/2015 | Finn | H01Q 7/00 174/261 |
| 2015/0269474 A1* | 9/2015 | Finn | G06K 19/07718 235/492 |
| 2015/0269477 A1* | 9/2015 | Finn | G06K 19/07794 235/492 |
| 2015/0294213 A1 | 10/2015 | Ziemkus | |
| 2017/0092612 A1* | 3/2017 | Zenz | G06K 19/07749 |
| 2017/0140257 A1* | 5/2017 | Zenz | H01L 21/4853 |
| 2017/0270398 A1* | 9/2017 | Mathieu | G06K 19/07733 |

FOREIGN PATENT DOCUMENTS

| | | |
|---|---|---|
| KR | 20020011361 | 2/2002 |
| WO | 2015173514 | 11/2015 |

\* cited by examiner

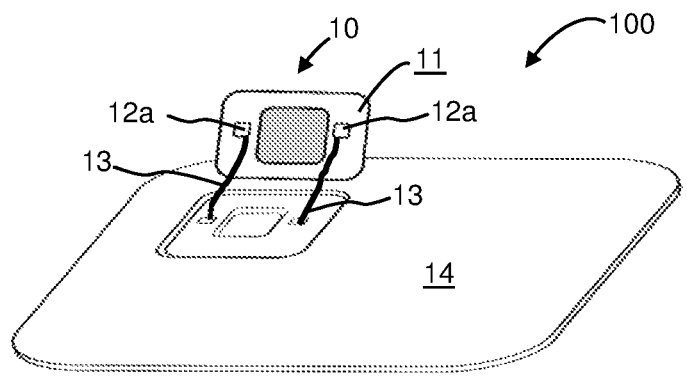
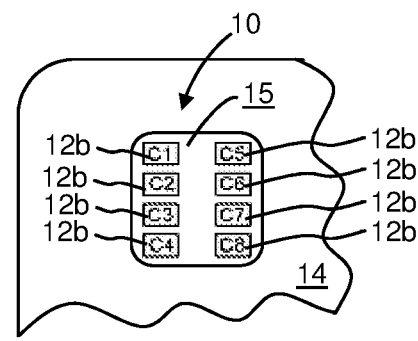
**Figure 1A
(Prior Art)**
**Figure 1B
(Prior Art)**
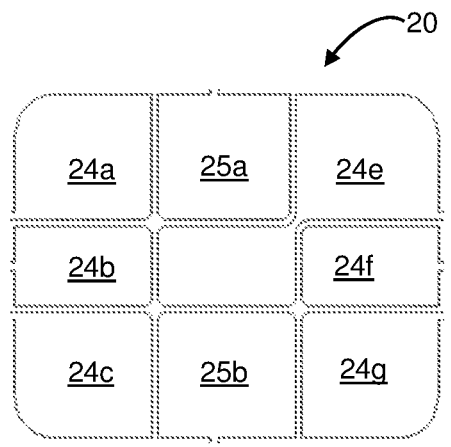
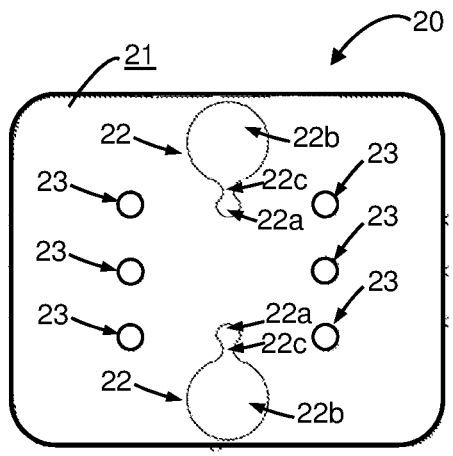
Figure 2A
Figure 2B
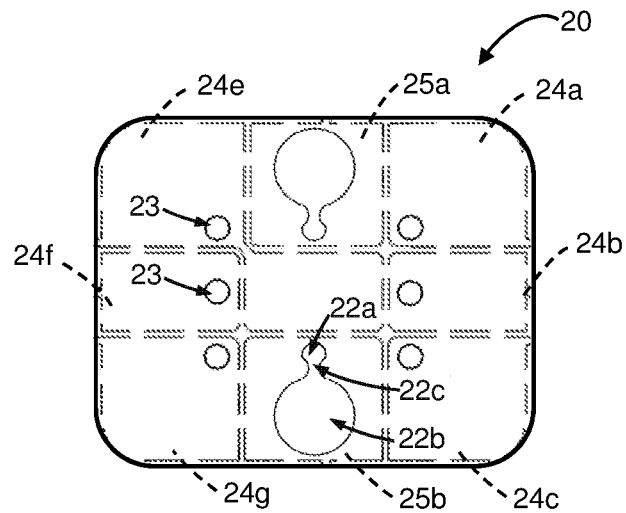
Figure 2C

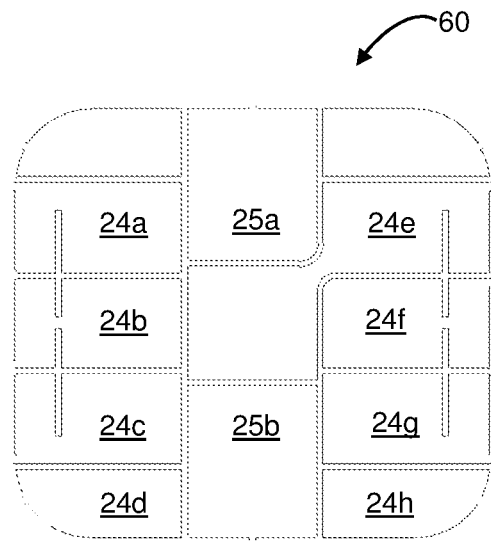
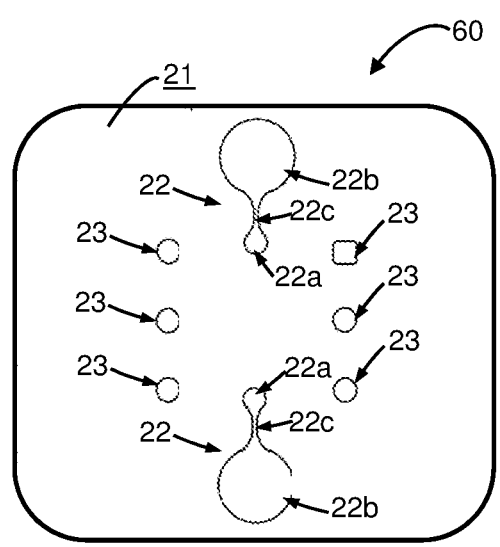
Figure 6A
Figure 6B
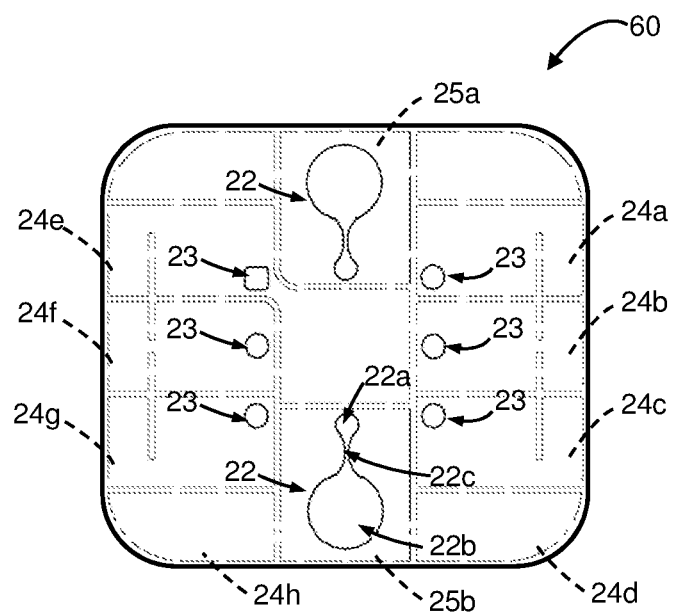
Figure 6C

INTEGRATED CIRCUIT MODULES AND SMART CARDS INCORPORATING THE SAME

CROSS REFERENCE TO RELATED APPLICATIONS

The present application is the U.S. national phase under 35 U.S.C. 371 of international patent application number PCT/SG2018/050074 filed on Feb. 15, 2018, which designated the U.S., and which claimed priority to international patent application number PCT/SG2017/050423 filed on Aug. 28, 2017, which are incorporated herein by reference.

FIELD OF INVENTION

The invention relates to smart cards and integrated circuit (IC) modules for smart cards, e.g. dual interface smart card, hybrid smart card, integrated circuit card (ICC) having multiple IC chips, as well as module or IC carrier tape adapted for use in fabrication of such smart cards and IC modules.

BACKGROUND

Dual interface smart cards incorporate an IC module which provides both direct contact and contactless interfaces (hereinafter "dual interface integrated circuit module"). Various arrangements of dual interface IC module and dual interface smart card, and methods of fabrication thereof are known.

FIG. 1A illustrates an existing smart card 100 incorporating an IC module 10 which requires a double plated module tape. A bonding side 11 of the IC module 10 is plated with conductive contact pads 12a for connecting with extracted terminals or portions 13 of an antenna embedded in the card body 14. A contact side or IC connector 15 of the IC module 10 is plated with conductive contact pads 12b (see FIG. 1B). By plating both sides of the module tape, the IC module is provided with a set of contact pads 12b on its contact side, which allow contact-based signal transmission with a contact-based card reader, and a another set of contact pads 12a on its bonding side which serve as points of contact between the IC module and an antenna embedded in the card body, wherein the antenna allows contact-free signal transmission to a contactless card reader.

To address the issues associated with double side plated tape construction, U.S. Pat. No. 9,390,365 B2 (Integrated circuit module for a dual-interface smart card) discloses a dual-interface IC module which utilizes a single-side plated module tape construction. Particularly, unused contact pads C4 and C8 are utilized as antenna contact pads for a dual-interface smart card. Based on current industry standards for smart cards, International Organization for Standardization (ISO) 7816, contact pads C4 and C8 are commonly designated as being reserved for future use (RFU), and are not typically required to deliver a particular signal to IC module. Remaining ISO designated contact pads C1 to C3, C5 and C7 are typically designated to deliver signals to IC module.

US Patent Application Publication No. 2017/0270398 A1 (Method for producing a circuit for a chip card module and circuit for a chip card module) discloses another single-side plated flexible electrical circuit for implementing a method for producing a chip card module.

SUMMARY

According to a first aspect of the invention, an integrated circuit (IC) module for a smart card with both contact and contactless interfaces is provided. The IC module comprises:

a non-conductive substrate having a plurality of single-bond holes and a pair of multi-bond holes, both extending from a first to a second side of the substrate;

a plurality of conductive contact pads, including a first pair thereof, arranged on the first side of the substrate;

a first IC chip arranged on the second side of the substrate;

a plurality of first conductive elements traversing the single-bond and the pair of multi-bond holes, and electrically connecting at least some of the contact pads to the first IC chip, wherein the first conductive elements include a first pair of first conductive elements respectively traversing the pair of multi-bond holes and electrically connecting the first pair of contact pads to the first IC chip; and an encapsulant deposited on the first IC chip, the first conductive elements and the first pair of contact pads, wherein the encapsulant deposited on the first pair of contact pads apportions each of the pair of multi-bond holes into a first and an adjoining second bonding channel respectively terminating at a first and an adjoining second bonding area on each of the first pair of contact pads such that the encapsulant seals the first bonding area and exposes the second bonding area through the second bonding channel to provide a surface for establishing electrical connection to the first IC chip, wherein the encapsulant partitions the first and the second bonding area from each other without requiring a presence of the substrate therebetween.

According to a second aspect of the invention, a smart card with both contact and contactless interfaces is provided. The smart card comprises:

a card body having a module cavity and an antenna coil;

a pair of antenna-connecting elements;

an integrated circuit (IC) module disposed in the cavity, the IC module comprising:

a non-conductive substrate having a plurality of single-bond holes and a pair of multi-bond holes, both extending from a first to a second side of the substrate;

a plurality of conductive contact pads, including a first pair thereof, arranged on the first side of the substrate;

a first IC chip arranged on the second side of the substrate;

a plurality of first conductive elements traversing the single-bond and the first pair of multi-bond holes and electrically connecting at least some of the contact pads to the first IC chip, wherein the first conductive elements include a first pair of first conductive elements respectively traversing the pair of multi-bond holes and electrically connecting the first pair of contact pads to the first IC chip; and an encapsulant deposited on the first IC chip, the first conductive elements and the first pair of contact pads, wherein the encapsulant deposited on the first pair of contact pads apportions each of the pair of multi-bond holes into a first and an adjoining second bonding channel respectively terminating at a first and an adjoining second bonding area on each of the first pair of contact pads such that the encapsulant seals the first bonding area, wherein at the second bonding channel, one of the pair of the antenna-connecting elements traverses the second bonding channel and connects between the antenna coil and the second bonding area such that electrical connection between the antenna coil and the first IC chip is established, wherein the encapsulant partitions the first and the second bonding area from each other without requiring a presence of the substrate therebetween.

According to a third aspect of the invention, a method of fabricating an integrated circuit (IC) module for smart card with both contact and contactless interfaces is provided. The method comprises:

having a non-conductive substrate having a plurality of single-bond holes and a pair of multi-bond holes, both extending from a first to a second side of the substrate, a plurality of conductive contact pads, including a first pair thereof, arranged on the first side of the substrate, a first IC chip arranged on the second side of the substrate, and a plurality of first conductive elements traversing the single-bond and the pair of multi-bond holes, and electrically connecting at least some of the contact pads to the first IC chip, wherein the first conductive elements include a first pair of first conductive elements respectively traversing the pair of multi-bond holes and electrically connecting the first pair of contact pads to the first IC chip; and depositing an encapsulant on the first IC chip, the first conductive elements and the first pair of contact pads, including apportioning each of the pair of multi-bond holes into a first and an adjoining second bonding channel respectively terminating at a first and an adjoining second bonding area on each of the first pair of contact pads, without requiring the substrate between the first and the second bonding area, partitioning the first bonding area from the second bonding area by sealing the first bonding area with the encapsulant to define the first bonding channel and expose the second bonding area through the second bonding channel to provide a surface for establishing electrical connection to the first IC chip.

According to a fourth aspect of the invention, a method of fabricating a smart card with both contact and contactless interfaces is provided. The method comprises:

having a card body having a module cavity and an antenna coil;

having the IC module of the first aspect of the invention or any embodiment according to the first aspect of the invention;

using an antenna-connecting element which traverses the second bonding channel within each of the first pair of multi-bond holes, electrically connecting one of the first pair of contact pads, via the second bonding area thereof, to the antenna coil;

applying an adhesive to the second side of the substrate; and implanting the IC module onto the card body with the second side of the substrate facing the module cavity of the card body.

According to a fifth aspect of the invention, a method of fabricating a smart card with both contact and contactless interfaces is provided. The method comprises:

having a card body having a module cavity and an antenna coil;

having the IC module of any one of claims 1 to 14;

depositing an antenna-connecting element on the second bonding area of each of the first pair of contact pads;

melting and bonding the antenna-connecting element to the second bonding area;

applying an adhesive to the second side of the substrate;

disposing the IC module in the module cavity of the card body with the second side of the substrate facing the module cavity of the card body and disposing the antenna-connecting element into proximity of the antenna coil; and concurrently applying heat and pressure to the card body and the IC module, including:

using the applied heat, melting the antenna-connecting element and thereby electrically connecting the antenna-connecting element to the antenna coil, and activating the adhesive; and using the applied pressure and activated adhesive, bonding the IC module to the card body.

According to a sixth aspect of the invention, a single-side plated integrated circuit (IC) carrier or module tape adapted for use in smart card with both contact and contactless interfaces is provided. The IC carrier or module tape comprises:

a non-conductive substrate having a plurality of single-bond holes and a pair of multi-bond holes, both extending from a first to a second side of the substrate;

a plurality of conductive contact pads, including a first pair thereof, arranged on the first side of the substrate;

wherein the second side of the substrate is adapted to be arranged with a first IC chip thereon;

wherein at least some of the contact pads are adapted to electrically connect to the first IC chip through a plurality of first conductive elements traversing the single-bond and the pair of multi-bond holes, wherein the first pair of contact pads are adapted to electrically connect to the first IC chip through a first pair of the first conductive elements traversing the pair of multi-bond holes; and wherein each multi-bond hole is adapted to be apportioned, by an encapsulant to be deposited on the first pair of contact pads into a first and an adjoining second bonding channel respectively terminating at a first and an adjoining second bonding area on each of the first pair of contact pads such that the encapsulant is adapted to seal the first bonding area and expose the second bonding area through the second bonding channel to provide a surface for establishing electrical connection to the first IC chip, wherein the first and the second bonding area are partitioned from each other, by the encapsulant, without requiring a presence of the substrate therebetween.

In one embodiment according to any one of the first to the sixth aspect of the invention, the first conductive elements include a second pair of first conductive elements, and wherein the encapsulant is further deposited on the second pair of first conductive elements respectively traversing the first bonding channel of the first pair of multi-bond holes and electrically connecting the first pair of contact pads to the first IC chip.

In one embodiment according to any one of the first to the sixth aspect of the invention, the IC module further comprises a second IC chip arranged on the second side of the substrate; and a pair of second conductive elements respectively traversing the first bonding channel of the pair of multi-bond holes and electrically connecting the first pair of the contact pads to the second IC chip, wherein the encapsulant is further deposited on the second pair of conductive elements.

In one embodiment according to any one of the first to the sixth aspect of the invention, the second bonding area is at least two times larger than the first bonding area.

In one embodiment according to any one of the first to the sixth aspect of the invention, the contact pads include two mutually exclusive pairs of contact pads being other than the first pair of contact pads, and wherein the first pair of contact pads are respectively juxtaposed between the two mutually exclusive pairs of contact pads. In one example, the contact pads other than the first pair of contact pads are arranged along first opposed edge portions of the substrate, wherein the first pair of contact pads and the two mutually exclusive pairs of contact pads are arranged along second opposed edge portions of the substrate, wherein the first and the second opposed edge portions are mutually transverse.

In one embodiment according to any one of the first to the sixth aspect of the invention, the first pair of contact pads are non-overlapping with the contact pads other than the first pair of contact pads. In one example, the first pair of contact pads are non-overlapping with contact pads designated by ISO 7816 as reserved for future use.

In one embodiment according to any one of the first to the sixth aspect of the invention, each of the first pair of multi-bond holes is formed of at least a first and a second aperture fluidly connected to each other and located at an opposed relation to the first and the second bonding area respectively, wherein the first aperture includes a width which is constricted relative to a width of the second aperture.

In one embodiment according to any one of the first to the sixth aspect of the invention, the first aperture of at least one of the first pair of multi-bond holes includes a length which is greater than or equal to a distance between two of the single-bond holes which are formed in adjacent ones of the contact pads.

In one embodiment according to any one of the first to the sixth aspect of the invention, the first aperture of the at least one of the first pair of multi-bond holes is arranged between the first IC chip and at least one single-bond hole.

In one embodiment according to any one of the first to the sixth aspect of the invention, the first IC chip includes a plurality of sides, wherein the first aperture of the at least one of the first pair of multi-bond holes is at least partially arranged in conformity with a contour defined by at least one of the sides of the first IC chip.

In one embodiment according to any one of the first to the sixth aspect of the invention, a third aperture, fluidly connecting between the first and the second aperture, includes a width which is constricted relative to the width of the first aperture and the width of the second aperture. In one example, the dimensions of the first and the second aperture are unequal. In the same or separate example, each of the first and the second aperture tapers towards the constricted aperture.

In one embodiment according to any one of the first to the sixth aspect of the invention, each of the first pair of multi-bond holes is formed of two partially overlapping circular apertures.

In one embodiment according to the second, the fourth or the fifth aspect of the invention, each of the pair of antenna-connecting elements includes a rigid conductive or solder bump, a conductive disc, or a flexible conductive bump comprising an electrically conductive adhesive.

BRIEF DESCRIPTION OF DRAWINGS

The invention will be described in detail with reference to the accompanying drawings, in which:

FIG. 1A shows an existing smart card incorporating an IC module which requires a double plated module tape;

FIG. 1B shows a contact side or IC connector of the IC module of FIG. 1A;

FIG. 2A shows a top view which is taken from a contact side of a module carrier tape segment, e.g. IC connector having six ISO designated contacts;

FIG. 2B shows a bottom view which is taken from a bonding side of the module tape segment of FIG. 2A;

FIG. 2C is a see-through view of FIG. 2B, wherein the footprints of the contact pads and the encapsulation are in dashed lines;

FIG. 6A shows a top view which is taken from a contact side of a module carrier tape segment, e.g. an IC connector with eight ISO designated contacts;

FIG. 6B shows a bottom view which is taken from a bonding side of the module tape segment of FIG. 6A;

FIG. 6C is a see-through view of FIG. 6B, wherein the footprints of the contact pads and the encapsulation are in dashed lines;

DETAILED DESCRIPTION

Figure 3A:
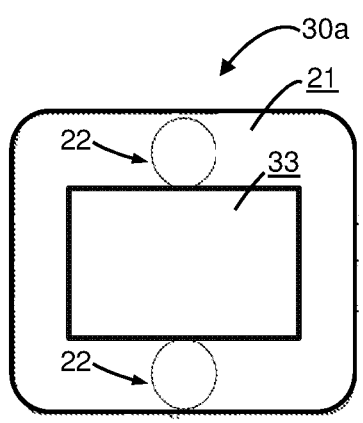
FIG. 3A shows a bottom view which is taken from a bonding side of an IC module having an IC connector with six ISO designated contacts according to one embodiment of the invention.

In the following description, numerous specific details are set forth in order to provide a thorough understanding of various illustrative embodiments of the invention. It will be understood, however, to one skilled in the art, that embodiments of the invention may be practiced without some or all of these specific details. It is understood that the terminology used herein is for the purpose of describing particular embodiments only, and is not intended to limit the scope of the invention. In the drawings, like reference numerals refer to same or similar functionalities or features throughout the several views.

Embodiments described in the context of one of the devices or methods are analogously valid for the other devices or methods. Similarly, embodiments described in the context of a device are analogously valid for a method, and vice versa.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

It should be understood that the articles "a", "an" and "the" as used with regard to a feature or element include a reference to one or more of the features or elements. The term "and/or" includes any and all combinations of one or more of the associated feature or element. The terms "comprising," "including," and "having" are intended to be open-ended and mean that there may be additional features or elements other than the listed ones. Identifiers such as "first", "second" and "third" are used merely as labels, and are not intended to impose numerical requirements on their objects, nor construed in a manner imposing any relative position or time sequence between limitations. Furthermore, terms such as "top", "bottom", "side", "under", "over" used herein are merely for ease of description and refer to the orientation of the features or elements as shown in the figures. It should be understood that any orientation of the features described herein is within the scope of the invention. Yet furthermore, the term "electrically connected" and related terms includes a reference to a presence or establishment of an electrical contact or electrically conductive path between the listed features or elements, and may, but not necessarily, further include a reference to transmission of electrical signals or current between the listed features or elements. Yet furthermore, terms such as "length" and "width" are not intended to impose directional requirements on their objects; however, "length" is generally understood as being greater or larger dimensioned than "width" in relation to the same object. In the context of a circular shape, the term "diameter" of the circular shape may be interchangeably used with the term "width".

It should be understood that references to "first aperture", "second aperture" and/or "third aperture" in context of a multi-bond hole are used merely as labels to refer to respective interconnected regions of the multi-bond hole, and are not intended to impose numerical requirements on the multi-bond hole, nor construed in a manner imposing any relative position between the apertures or time sequence in forming the multi-bond hole.

References to ISO standards, including ISO 7816, refer to International Standards applicable at the priority date and/or filing date of the present patent application, and may refer to revisions thereafter as appropriate and appreciated by persons skilled in the art. Incorporation by reference is made herein to the ISO 7816 specification in its entirety to provide context for the invention and should not be construed to limit the scope of the invention. It is to be appreciated that the scope of the invention may be understood and defined without full details of the ISO standards.

FIG. 2A shows a top view which is taken from a contact side of a module carrier tape segment 20 having a plurality of conductive contact pads, e.g. IC connector having six ISO designated contact pads. FIG. 2B shows a bottom view which is taken from a bonding side of the module tape segment 20 of FIG. 2A having a plurality of holes according to one embodiment of the invention. FIG. 2C is a see-through view of FIG. 2B, wherein the footprints of the contact pads and the encapsulation are in dashed lines.

The module carrier tape segment 20 comprises a non-conductive substrate 21, e.g. glass epoxy, having a first and a second side. A plurality of through holes 22, 23 perforate the substrate 21 wherein each hole extends from the first to the second side of the substrate 21. On the first side of the substrate 21, a plurality of conductive contact pads, e.g. metal pads, are arranged, e.g. plated, over the holes. At least some of the contact pads are sized, shaped and arranged in compliance with International Organization for Standardization (ISO) standards for the manufacture of smart cards. Each contact pad has an external side and an internal side. In operation, the external side of the contact pads make electrical contact with a contact-type smart card reader or electronic terminal to allow signal transmission between the card reader and an IC chip electrically connected to the contact pads. The internal side of a contact pad is accessible through one of the holes to allow one or more conductive elements to be disposed therethrough to establish electrical connection with the contact pad.

FIGS. 2B and 2C show two sets of the holes 22, 23 having unequal dimensions, e.g. diameters, and/or different shapes. The first set of holes 22 may be hereinafter referred to as "multi-bond holes" or "enlarged holes" which are greater or larger in size, area and/or diameter relative to the second set of holes. Each multi-bond hole 22 is configured to receive multiple conductive elements, e.g. wire bond(s), antenna wire/terminals and/or other conductive element.

Each multi-bond hole 22 may be formed of a plurality of interconnected apertures, e.g. a first aperture 22a and a second aperture 22b fluidly connected to each other. The first and the second aperture 22a, 22b may have unequal dimensions, e.g. diameters. The interconnection between the first aperture 22a and second aperture 22b may optionally be referred to as a third aperture 22c which is constricted relative to the first and the second aperture 22a, 22b. In one embodiment, a diameter of the second aperture 22b is greater than a diameter of the first aperture 22a, e.g. by at least two times. In an illustrative example, the first aperture 22a may have a diameter of about 0.6 mm to about 0.9 mm, while the second aperture 22b may have a diameter of about 2.0 mm. As shown in FIGS. 2B and 2C, the first and the second aperture 22a, 22b may taper towards the constricted third opening 22c, but it is to be appreciated that other examples may not include tapering of the first and the second aperture 22a, 22b towards each other. In a further illustrative example (not shown), a multi-bond hole may be provided as two partially overlapping circular apertures. It is to be appreciated that multi-bond holes may take on other shapes and/or arrangements which may not have been illustrated in the accompanying Figures. For example, a multi-bond hole may be formed of one or more polygons and/or irregular shapes which overlap or interconnect with each other.

The second set of holes 23 may be hereinafter referred to as "single-bond holes" or "small holes" which are smaller in size, area and/or diameter compared to the first set. Each single-bond hole 23 may be configured to receive a single conductive element, e.g. wire bond, and has a diameter of about 0.6 mm to about 0.9 mm. In certain examples, each single-bond hole 23 may have same size, area and/or diameter as the first aperture 22a of a multi-bond hole 22.

It is to be appreciated that in one embodiment, multi-bond holes may be provided with mutually distinct shapes and/or dimensions. For example, some of the multi-bond holes may have shapes and/or dimensions distinct from single-bond holes, as described above, while a remaining of the multi-bond holes may have shapes and/or dimensions similar to the single-bond holes 23, e.g. diameter of about 0.6 mm to about 0.9 mm, but configured to receive two or more conductive elements, e.g. wire bonds, therein.

The various holes 22, 23 are constructed and arranged to provide direct access to the internal side of respective contact pads 24a, 24b, 24c, 24e, 24f, 24g, 25a, 25b. Particularly, each single-bond hole 23 provides access to a contact pad which has been designated for use based on existing ISO or industry standards as a signal pin-out. According to ISO 7816, an IC connector on an IC card or smart card provide six or eight contact pads and at least some of these contact pads are electrically connected to IC chip(s) embedded in the card body. The contact pads are designated as C1 to C8, where C1 is designated for supply voltage Vcc, C2 is designated for reset signal RST, C3 is designated for clock signal CLK, C4 is designated for ground GND, C6 is designated for programming input voltage Vpp (optional) and C7 is designated for input/output signal I/O. C4 and C8 are designated as reserved for future use and are commonly unused. Referring to the example illustrated in FIGS. 2A to 2C, contact pads C1 to C3 and C5 to C7 may respectively correspond to six contact pads 24a to 24c and 24e to 24g, however, it is to be appreciated that the aforementioned designations and/or arrangement may be adapted according to modifications in ISO or industry standards.

Referring to the embodiment illustrated in FIGS. 2A to 2C, the conductive pads include a first pair of contact pads, which may be hereinafter referred to as "module-side antenna contact pads" 25a, 25b, and contact pads 24a, 24b, 24c, 24e, 24f, 24g. Among these contact pads are two distinct or mutually exclusive pairs of contact pads, e.g. (24a, 24e) and (24c, 24g). The module-side antenna contact pads 25a, 25b are respectively juxtaposed between the two mutually exclusive pairs of contact pads (24a, 24e) and (24c, 24g), i.e. 25a is juxtaposed between 24a and 24e while 25b is juxtaposed between 24c and 24g.

In certain examples, the contact pads other than the module-side antenna contact pads, i.e. six ISO designated contact pads C1, C2, C3, C5, C6 and C7 respectively corresponding to 24a to 24c, 24e to 24g, may be arranged along first opposed edge portions, e.g. opposed width edges, of the substrate 21 at locations which are ISO designated contact locations. The module-side antenna contact pads 25a, 25b and the two mutually exclusive pairs of contact pads (24a, 24c) and (24e, 24g) are arranged along second opposed edge portions, e.g. opposed length edges, of the substrate 21. The two mutually exclusive pairs of contact pads (24a, 24c) and (24e, 24g) may be arranged at locations which are ISO designated contact locations, however, the module-side antenna contact pads 25a, 25b are located at non-ISO designated contact locations. The pair of first opposed edge portions and the pair of second opposed edge portions are generally mutually transverse. If the substrate 21 or module tape segment 20 has a generally rectangular or square shape, the two mutually exclusive pairs of contact pads (24a, 24c) and (24e, 24g) may be, but not necessarily, arranged at corner or near-corner portions of the substrate 21.

It is to be appreciated that the module-side antenna contact pads 25a, 25b are non-overlapping with ISO designated locations of C1 to C3 and C5 to C7 contact pads on an IC connector, e.g. 24a to 24c, 24e to 24g. In other words, the module-side antenna contact pads 25a, 25b are arranged at locations on an IC connector, which are undesignated or unspecified by existing ISO or industry standards whether for current use or reserved for future use.

Figure 3B:
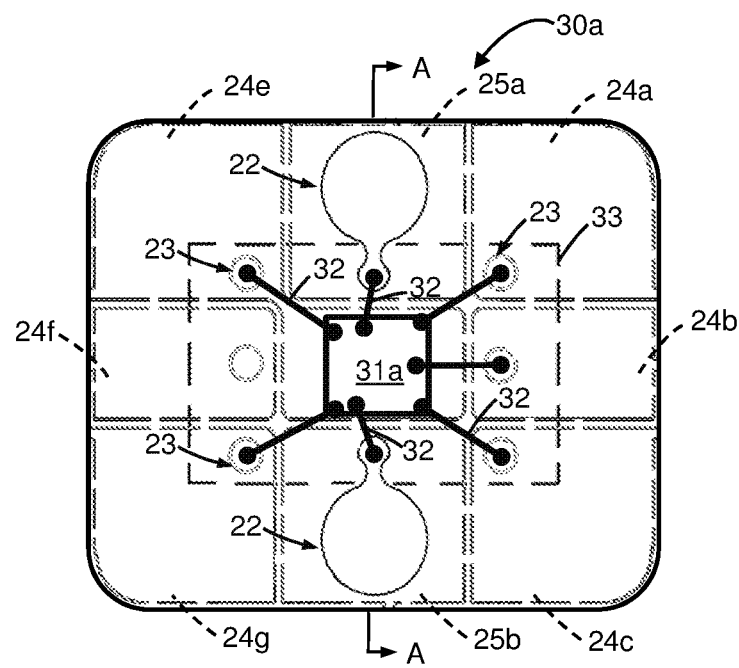
FIG. 3B is a see-through view of FIG. 3A, wherein the footprints of the contact pads and the encapsulation are in dashed lines.
Figure 3C:
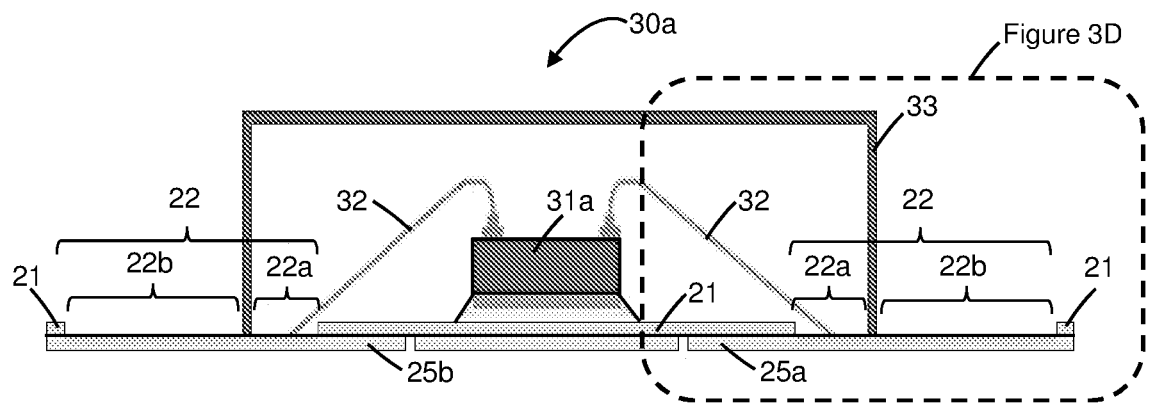
FIG. 3C is a cross-sectional view of the IC module taken along line A-A in FIG. 3B.
Figure 3D:
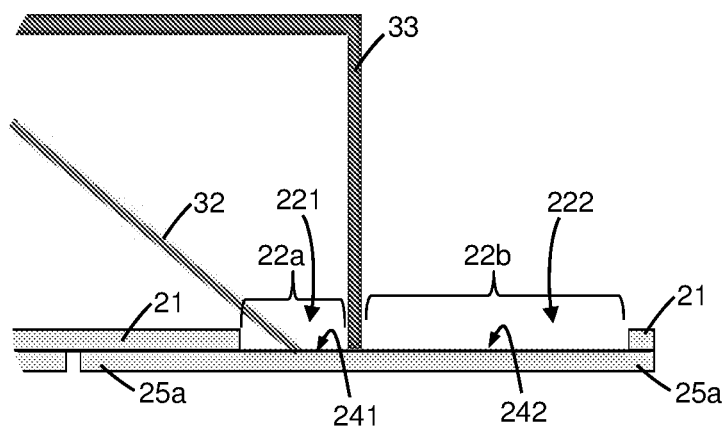
FIG. 3D is a partial close-up view of FIG. 3C.

FIG. 3A shows a bottom view which is taken from a bonding side of an IC module 30a according to one embodiment of the invention. FIG. 3B is a see-through view of FIG. 3A, wherein the footprints of the contact pads and the encapsulation are in dashed lines. FIG. 3C is a cross-sectional view of the IC module 30a taken along line A-A in FIG. 3B, and FIG. 3D is a partial close-up view of FIG. 3C. The IC module 30a comprises the module carrier tape segment 20 of FIGS. 3A and 3B, a first IC chip 31a arranged, e.g. bonded by adhesive, on the second side of the substrate 21, a plurality of first conductive elements 32 electrically connecting at least some of the contact pads to the first IC chip 31a, and an encapsulant 33 deposited on the first IC chip 31a and the first conductive elements 32.

The first conductive elements 32, e.g. metal wires, traverse the holes 22, 23 to electrically connect the internal sides of the contact pads to on-chip pads of the first IC chip 31*a*, such as by wire-bonding process. As illustrated for at least some of the single-bond holes 23, each hole 23 receives therein a single first conductive element 32; for at least some of the multi-bond holes 22, each hole 22 receives therein multiple conductive elements, including one or more first conductive element 32 electrically connecting module-side antenna contact pad 25*a*/25*b* to one or more IC chips and a connection to an antenna coil.

The encapsulant or encapsulation 33 is deposited on the first IC chip 31*a* and the first conductive elements 32 to encapsulate, e.g. fully enclose, them and protect them from exposure and damage. Particularly, the encapsulant 33 is deposited into single-bond holes 23 having first conductive elements 32 such that these single-bond holes 23 are fully filled and conductive elements therein are encapsulated. The encapsulant 33 is further deposited into a pair of multi-bond holes 22, such that these multi-bond holes 22 are partially filled with encapsulant 33 and partially void of encapsulant.

The encapsulant 33 deposited into a multi-bond hole 22, particularly the encapsulant 33 deposited on the module-side antenna contact pads 25*a*/25*b*, apportions the multi-bond hole 22 into a first and an adjoining second bonding channel 221, 222 respectively terminating at a first and an adjoining second bonding area 241, 242 on the internal side of one of the module-side antenna contact pads 25*a*/25*b* (see FIG. 3C). A boundary between the first and the adjoining second bonding area 241, 242 is therefore provided by an edge or part thereof of the encapsulant 33 which is disposed on the module-side antenna contact pads 25*a*/25*b*.

More particularly, the encapsulant 33 encapsulates a first pair of the first conductive elements 32 which respectively traverse the pair of multi-bond holes 22, and is deposited on or overlays a portion of an internal side of the module-side antenna contact pads 25*a*, 25*b*. Each portion, being deposited or overlaid with the encapsulant 33, is defined as the first bonding area 241 of a module-side antenna contact pad 25*a*/25*b*, while the encapsulated channel within multi-bond hole 22 is defined as the first bonding channel 221 (see FIG. 3D). The encapsulant seals this first bonding area 241 and therefore prevents access to the first bonding area 241, as well as the first bonding channel 221, by other non-encapsulated elements, e.g. other wires, conductive elements, which are provided after the encapsulation procedure. In other words, with the deposited encapsulant 33, the first bonding area 241 and the first bonding channel 221 are inaccessible at least for the purpose of receiving electrical connection, e.g. conductive elements.

A remaining portion of the internal side of the module-side antenna contact pad 25*a*/25*b*, which is not deposited or overlaid with the encapsulant 33 and therefore remains accessible or exposed through the multi-bond hole 22, is defined as the second bonding area 242. The unencapsulated channel within the multi-bond hole 22 is defined as the second bonding channel 222 (see FIG. 3D). This second bonding area 242, being devoid of encapsulation, is accordingly accessible or exposed through the second bonding channel 222 within the multi-bond hole 22 to provide a surface for establishing electrical connection to the first IC chip 31*a* via the respective module-side antenna contact pad 25*a*/25*b*.

As illustrated in FIGS. 3C and 3D, the first bonding area 241 is located at an opposed relation to the first aperture 22*a* of the multi-bond hole 22, e.g. the first bonding area 241 is directly under the first aperture 22*a*. Likewise, the second bonding area 241 is arranged at an opposed relation to the second aperture 22*b* of the multi-bond hole 22, e.g. the second bonding area 242 is directly under the second aperture 22*b*. This relative arrangement of bonding area and apertures as illustrated in FIGS. 3C and 3D may vary in other embodiments.

It is to be appreciated that the first and the second bonding area 241, 242 are adjoining and electrically connected to each other, while the first and the second bonding channel 221, 222 are adjoining. It is to be appreciated that the first and the second bonding area 241, 242 are integral portions of one module-side antenna contact pad 25*a*/25*b* and located on a same side thereof. It is to be appreciated that the second bonding area 242 may be at least two times larger than the first bonding area 241.

Accordingly, the encapsulation 33, which is deposited on module-side antenna contact pads 25*a*/25*b*, partitions each module-side antenna contact pad 25*a*/25*b* as well as the multi-bond hole 22 accessing the same module-side antenna contact pad to provide mutually exclusive channels for accommodating different electrical connections and/or types thereof. By using the encapsulation, the first and the second bonding area 241, 242 (or the first and the second bonding channels 221, 222) are partitioned without requiring a presence of substrate therebetween to function as partition, and therefore reduces a footprint or size requirement of the contact pads. Furthermore, dimensions, shape and/or arrangement of the contact pads do not need to be substantially altered.

Figure 3E:
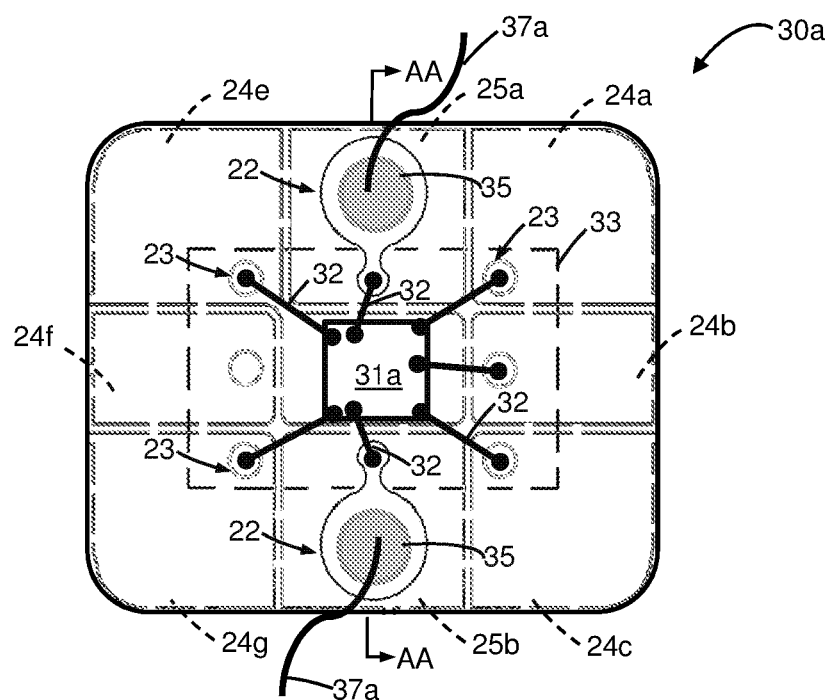
FIG. 3E shows the IC module of FIGS. 3A to 3D being worked upon to establish electrical connection to an antenna coil which is incorporated or embedded in a card body.
Figure 3F:
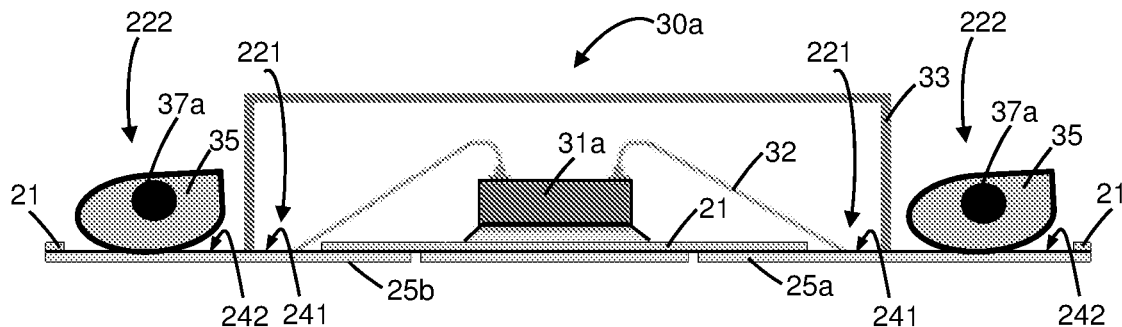
FIG. 3F is a cross-sectional view of the IC module taken along line AA-AA in FIG. 3E.
Figure 3G:
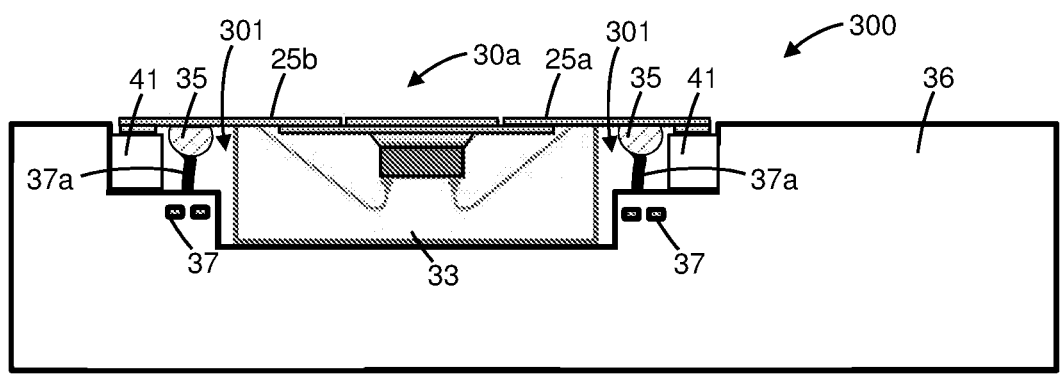
FIG. 3G shows a cross-sectional view of a smart card incorporating the IC module of FIGS. 3A to 3C.

FIG. 3E shows the IC module 30*a* of FIGS. 3A to 3D being worked upon to establish electrical connection to an antenna coil 37 which is incorporated or embedded in a card body. A method for fabricating a smart card is described as follows with reference to FIGS. 3E, 3F and 3G wherein FIG. 3G shows a smart card 300 incorporating the IC module 30*a*, and with further reference to the flowchart of FIG. 10. However, the method is equally applicable to IC modules 30*b*, 30*c*, 70, 80, 90 of FIGS. 4A, 4B, 5A, 5B, 7B, 7C, 8B, 8C, 9B, 9C.

Figure 10:
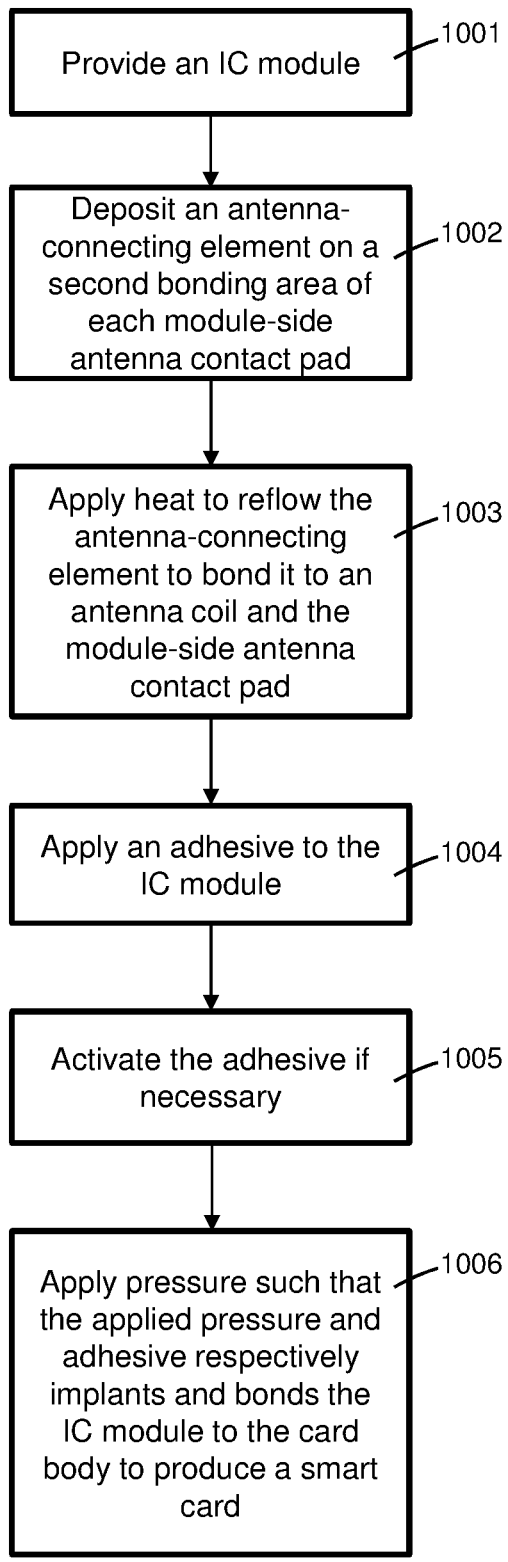
FIG. 10 shows a flowchart for a method for fabricating a smart card.

In block 1001 of FIG. 10, one or more IC modules 30*a*, having encapsulation, are provided.

In block 1002, an antenna-connecting element, e.g. conductive or solder paste 35, is deposited on each second bonding area 242 of the module-side antenna contact pads 25*a*, 25*b* (see FIG. 3E).

In block 1003, the IC module 30*a* is brought near a card body 36, wherein cavities have been milled in the card body 36 to a depth that is sufficient to expose portions or terminals of the antenna coil 37. At each module-side antenna contact pad 25*a*/25*b*, an exposed terminal 37*a* of the antenna coil 37 is brought into proximity of or contact with the second bonding area 242. The antenna-connecting element is subject to reflow wherein heat is applied to melt the conductive paste 35. The melted conductive paste 35 is allowed to cool or cure to form a bond, e.g. rigid conductive bump 35, with the exposed terminal 37*a* of the antenna coil 37 and with the second bonding area 242 of a module-side antenna contact pad 25*a*/25*b*. This results in the antenna coil 37 establishing electrical connection with both the module-side antenna contact pads 25*a*, 25*b*. The IC module 30*a*, which is now electrically connected to the antenna coil 37, may be now be implanted onto a card body 36 to produce a smart card 300.

To this purpose, in block 1004, an adhesive, e.g. glue tape, may be applied to the bonding side of the IC module 30*a*, e.g. substrate 21.

In block 1005, heat may be applied to activate the adhesive, if necessary. The bonding side of the IC module 30*a* may be arranged facing towards or placed in a module cavity formed in the card body 36.

In block 1006, pressure may be applied such that applied pressure and activated adhesive respectively implants and bonds the IC module 30*a* to the card body 36 to produce a smart card 300. Other steps, e.g. hot stamping, may be taken to customise the card body 36 or smart card 300 according to the intended usage.

The above-described method for fabricating a smart card may be modified by combining the step of establishing electrical connection between antenna coil 37 and module-side antenna contact pads 25*a*, 25*b* and the step of implanting an IC module 30*a* onto a card body 36 into a single step. The modified method is described below with reference to the flowchart of FIGS. 11 and 9D to 9G. However, the method is equally applicable to IC modules 30*a*, 30*b*, 30*c*, 70, 80 of FIGS. 3B, 3C, 3G, 4A, 4B, 5A, 5B, 7B, 7C, 8B, 8C.

Figure 11:
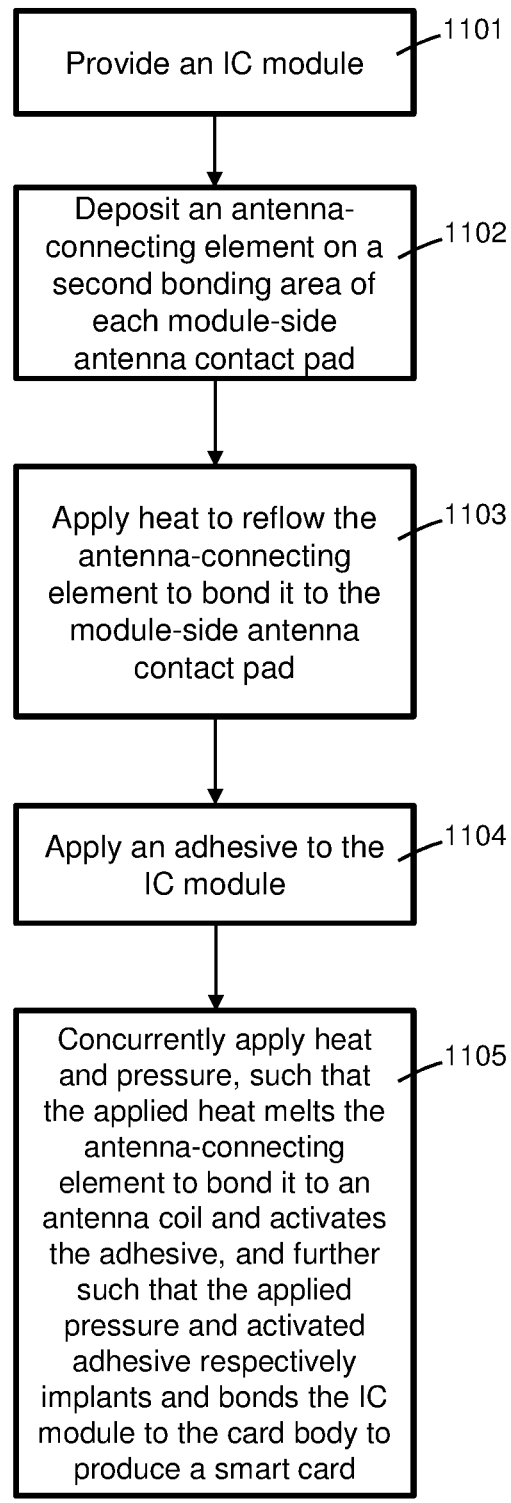
FIG. 11 shows a flowchart for another method for fabricating a smart card.

In block 1101 of FIG. 11, one or more IC modules 90, having encapsulation, are provided.

Figure 9A:
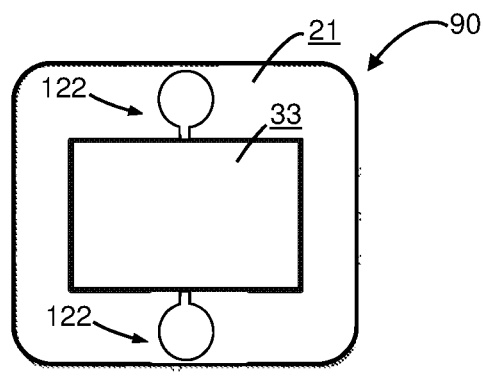
FIG. 9A shows a bottom view which is taken from a bonding side of an IC module having an IC connector with eight ISO designated contacts according to one embodiment of the invention.
Figure 9B:
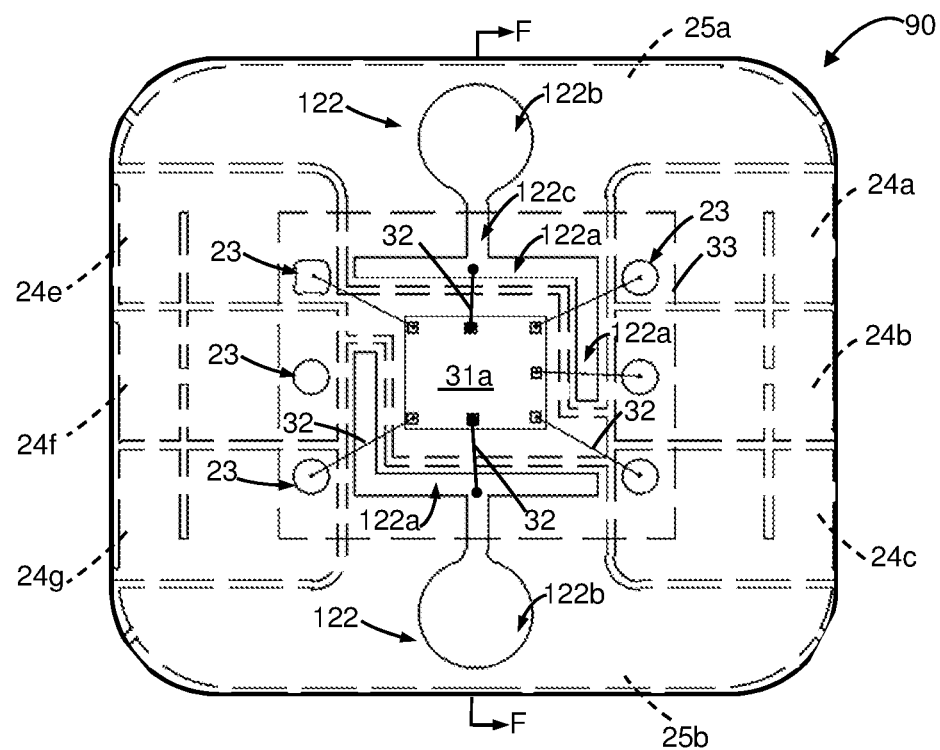
FIG. 9B is a see-through view of FIG. 9A, wherein the footprints of the contact pads and the encapsulation are in dashed lines.
Figure 9C:
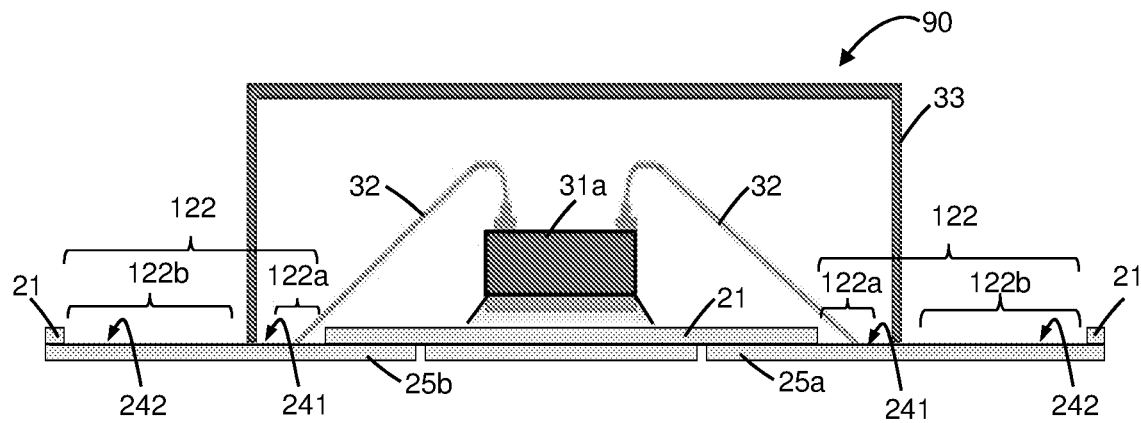
FIG. 9C is a cross-sectional view of the IC module taken along line F-F in FIG. 9B.
Figure 9D:
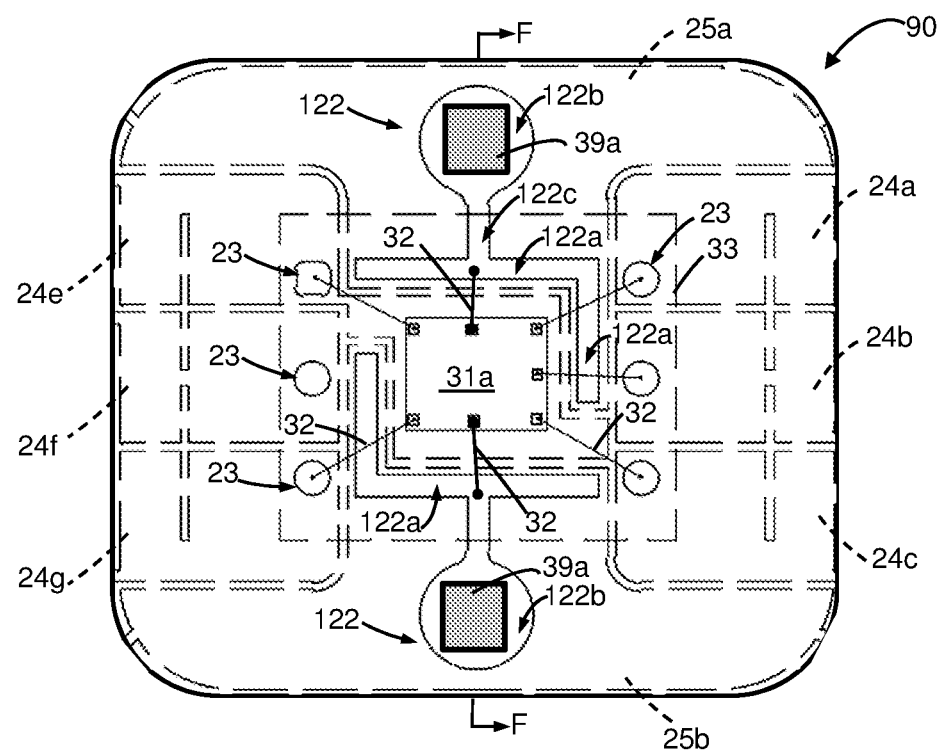
FIG. 9D shows the example of FIG. 9B which is disposed with antenna-connecting elements prior to reflow.
Figure 9E:
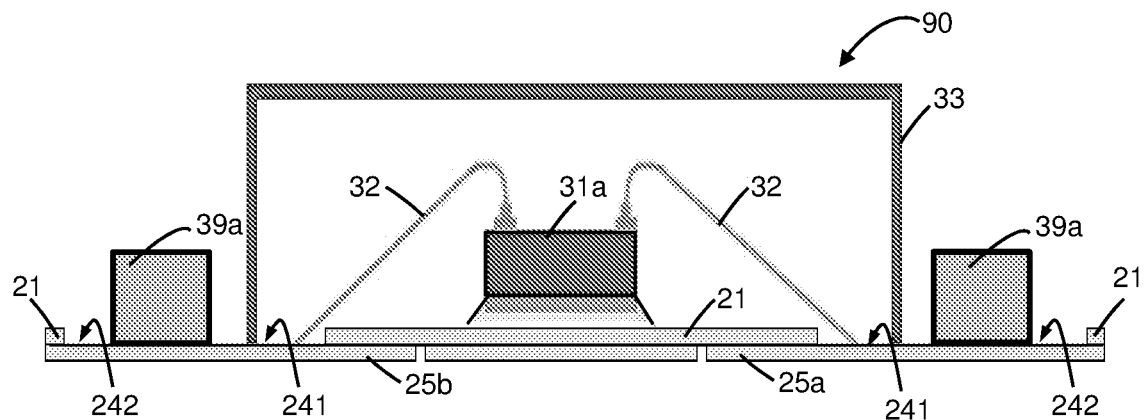
FIG. 9E is a cross-sectional view of the IC module taken along line F-F in FIG. 9D.

In block 1102, an antenna-connecting element 39*a*, e.g. conductive or solder ribbon or paste, is deposited on a second bonding area 242 of each module-side antenna contact pad 25*a*/25*b* (see FIGS. 9D and 9E for antenna-connecting element 39*a* prior to reflow).

Figure 9F:
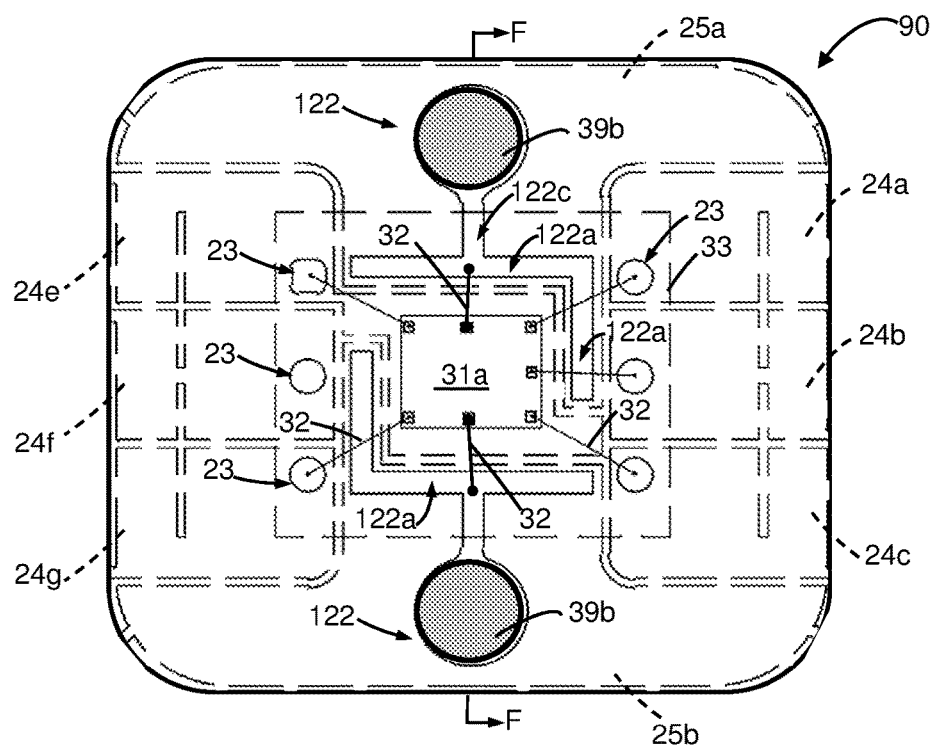
FIG. 9F shows the example of FIG. 9D which is disposed with antenna-connecting elements after reflow.
Figure 9G:
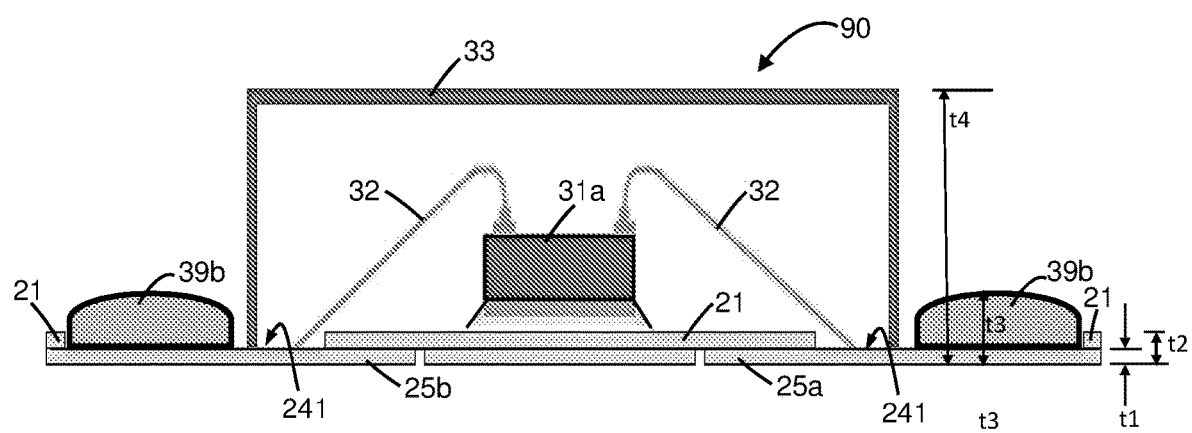
FIG. 9G is a cross-sectional view of the IC module taken along line F-F in FIG. 9F.

In block 1103, the antenna-connecting element 39*a* is subject to reflow wherein heat is applied to melt the antenna-connecting element 39*a* and bond it to the second bonding area 242 of a module side antenna contact pad 25*a*/25*b* (see FIGS. 9F and 9G for antenna-connecting element 39*b* after reflow). Reflow of the antenna-connecting element also controls or defines the height of the antenna-connecting element. Reflow of the antenna-connecting element also at least partially fills the second bonding area with the antenna-connecting element.

In one embodiment, e.g. FIGS. 9D to 9G, the module-side antenna contact pad 25*a*/25*b* may have a thickness (t1) of about 70 micro meters (μm), the substrate and contact pad 25*a*/25*b* may have a combined thickness (t2) of about 190 μm±20 μm, the module-side antenna contact pad 25*a*/25*b* and antenna-connecting element 39*b* have a combined thickness (t3) of about 300 micro meters (μm)±80 μm, and the module may have a thickness (t4) of up to about 600 μm.

In block 1104, an adhesive may be applied to the bonding side of the IC module, e.g. substrate 21.

In block 1105, the IC module, together with the reflowed antenna-connecting element 39*b* and adhesive applied thereto, is disposed in a module cavity of the card body 36 with the second side of the substrate facing the module cavity of the card body 36 while the antenna-connecting element is disposed in proximity and/or contact with an exposed terminal 37*a* of the antenna coil 37. Heat and pressure are applied to the card body 36 and the IC module 30*a* disposed therein. The applied heat melts the antenna-connecting element 39*b* as well as activates the adhesive. Each antenna-connecting element 39*b* further forms a bond with the exposed terminal 37*a* (or card-side antenna contact pad in certain embodiments) to establish electrical connection between antenna coil 37 and module-side antenna contact pad 25*a*/25*b* through the antenna-connecting element. Concurrently, the applied pressure and activated adhesive respectively implants and bonds the IC module 30*a* to the card body 36 to produce a smart card 300.

FIG. 3G shows a smart card 300 in which the IC module 30*a* of FIG. 3A to 3C has been implanted onto or bonded to a card body 36 using any of the above-described or other methods. The card body 36 may have been produced by laminating layers, e.g. plastic substrate, and milling a module cavity in the laminated layers, which is constructed and arranged to accommodate the IC module 30*a*. The laminated layers include a layer incorporating or embedding an antenna coil 37 for implementing contactless interface. In operation, when the smart card is brought into operating proximity of a contactless-type card reader, antenna of the smart card enters a magnetic field produced by the card reader to induce an alternating current which is converted to power the IC chip and allow data transmission between the IC chip in the IC module and the card reader in a contactless manner.

The IC module 30*a* is disposed in the module cavity. An adhesive 41 disposed between the bonding side of the IC module 30*a*, e.g. substrate 21, and the card body 36 secures the IC module 30*a* to the card body 36.

As illustrated in FIG. 3G, the arrangement of the card body 36, the adhesive 41 as well as the substrate 21, module-side antenna contact pad 25*a*/25*b* and encapsulation 33 of the IC module 30*a* define a space or enclosure 301. This space 301 or enclosure is arranged or aligned under the second aperture 22*b* of a multi-bond hole 22 such that the second bonding area 242 of the module-side antenna contact pad is accessible or exposed through the space 301, the second aperture 22*b* and the second bonding channel 222. An antenna-connecting element e.g. conductive bump 35, and a terminal 37*a* of antenna coil 37, traverse this space 301, the second aperture 22*b* and second bonding channel 222 of a multi-bond hole 22 and electrically connects to the second bonding area 242 of the module-side antenna contact pad 25*a*/25*b*. Accordingly, the antenna-connecting element establishes an electrical connection between the antenna coil 37 embedded in the card body 36 and the module-side antenna contact pad 25*a*/25*b*.

As an IC module typically provides two module-side antenna contact pads 25*a*, 25*b*, two multi-bond holes 22 are typically required in the IC module according to the invention and two antenna-connecting elements respectively connect two module-side antenna contact pads 25*a*, 25*b* to the IC chip 31*a*. It is to be appreciated from FIG. 3G that at each multi-bond hole, the first aperture 22*a* is at least substantially filled with encapsulant 33 in order to seal the first bonding area while the second aperture is unfilled or at most partially filled with encapsulant 33 in order to accommodate an antenna-connecting element 39, e.g. conductive bump 35, and exposed terminals 37*a* of antenna coil 37. The constricted third aperture 22*c* interconnecting the first and the second aperture 22*a*, 22*b* may be filled or unfilled.

Figure 4A:
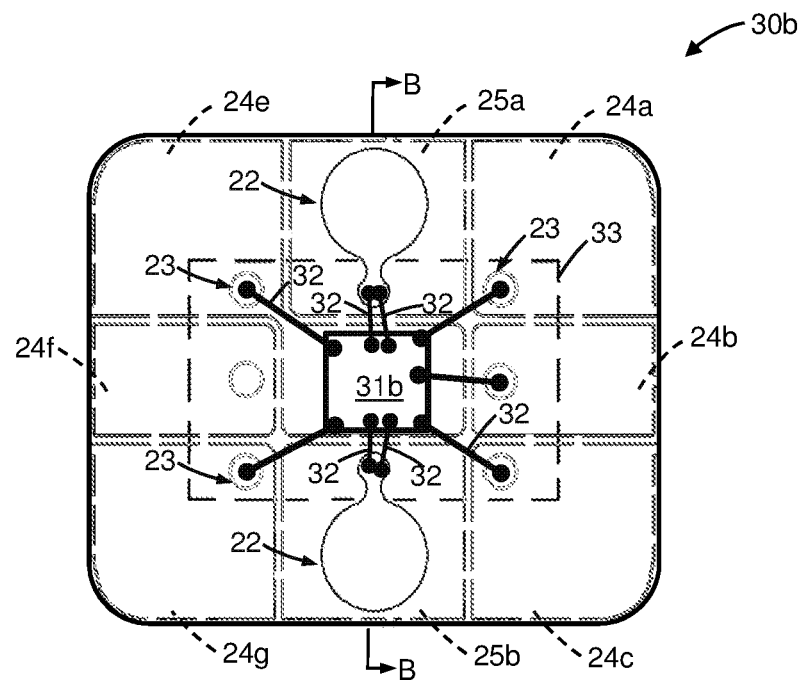
FIG. 4A shows a see-through view which is taken from a bonding side of an IC module having an IC connector with six ISO designated contacts according to another embodiment of the invention, wherein the footprints of the contact pads and the encapsulation are in dashed lines.
Figure 4B:
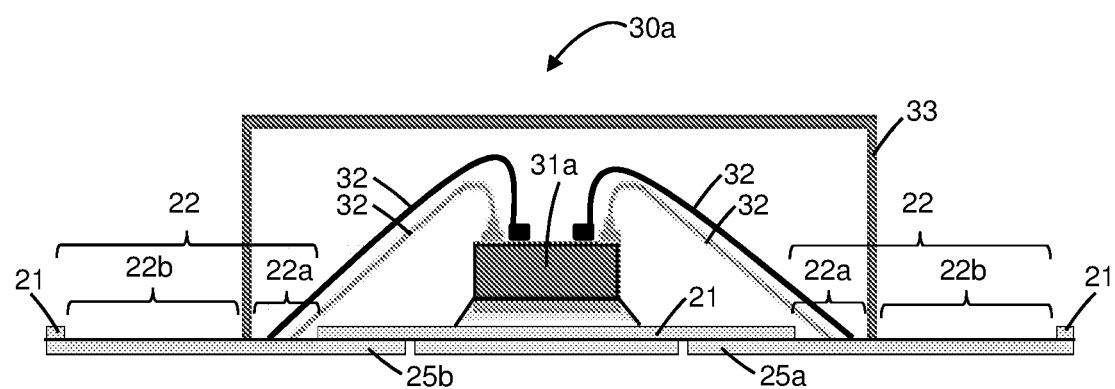
FIG. 4B is a cross-sectional view of the IC module taken along line B-B in FIG. 3A.

FIG. 4A shows a see-through view which is taken from a bonding side of an IC module 30*b* according to another embodiment of the invention, wherein the footprints of the contact pads and the encapsulation are in dashed lines. FIG. 4B is a cross-sectional view of the IC module 30*b* taken along line B-B in FIG. 4A. As illustrated, for at least some of the single-bond holes 23, each hole 23 receives therein a single first conductive element 32; for the multi-bond holes 22, each hole 22 receives therein multiple conductive elements, including a first and a second pair of first conductive elements 32. More particularly, the first and the second pair of first conductive elements 32 electrically connect a module-side antenna contact pad 25*a*/25*b* to different on-chip pads of the first IC chip 31*a*. These first and second pair of first conductive elements 32 traverse the first aperture 22*a* of the multi-bond hole 22 and are encapsulated by an encapsulant 33. Similar to the embodiment of FIGS. 3A to 3G, the encapsulant 33 is deposited on a portion of the module-side antenna contact pad to define a first bonding area 241. The encapsulation seals the first bonding area 241 and prevents access thereto. The encapsulation also defines a first bonding channel 221 terminating at the first bonding area 241. A second bonding area 242 on the module-side antenna contact pad 25a/25b, being adjoining and electrically connected to the first bonding area 241, is not deposited with the encapsulant 33 and therefore remains accessible or exposed through a second bonding channel 222 terminating at the second bonding area 242, e.g. through the second aperture 22b of the multi-bond hole 22. This second bonding area 242, being devoid of encapsulation, is accordingly accessible or exposed through the multi-bond hole 22 as a surface for establishing electrical connection to the first IC chip 31a.

Figure 4C:
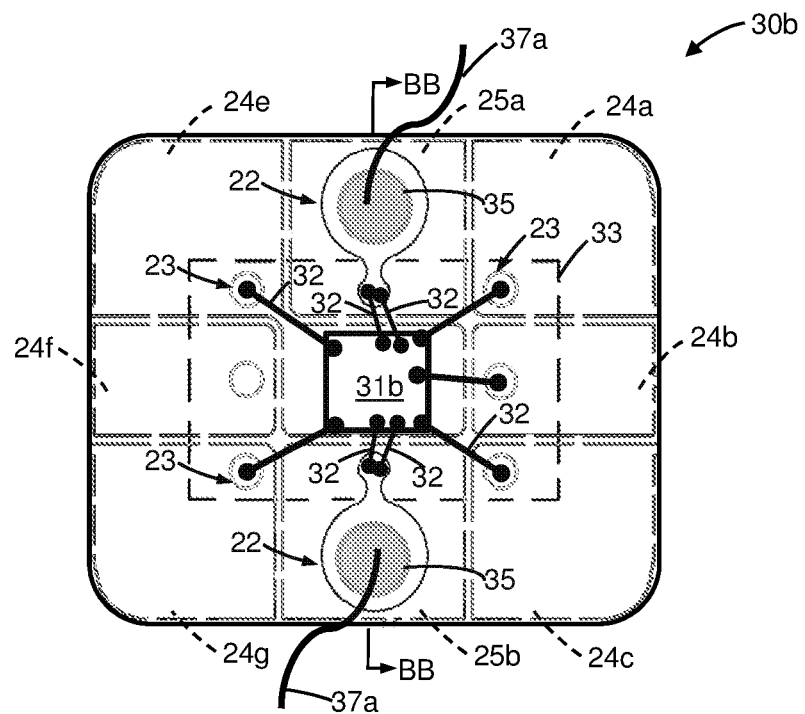
FIG. 4C shows the IC module of FIGS. 4A to 4B being worked upon to establish electrical connection to an antenna coil which is incorporated in a card body.
Figure 4D:
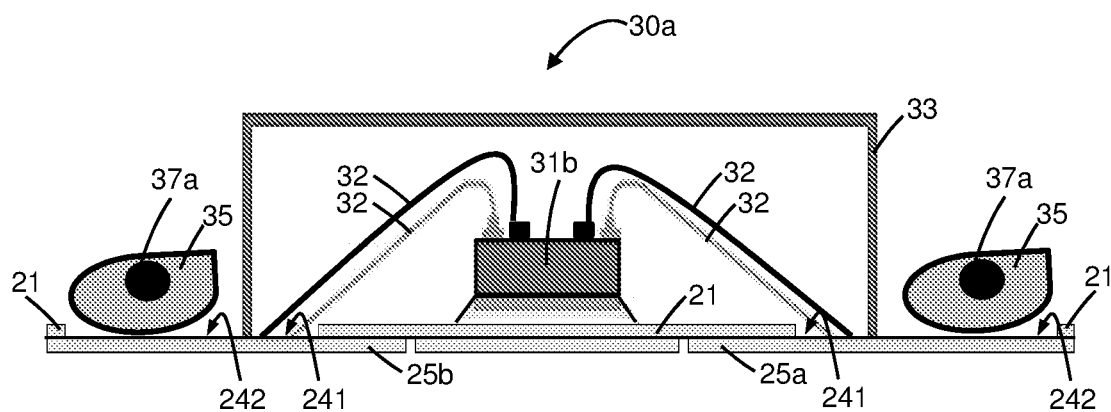
FIG. 4D is a cross-sectional view of the IC module taken along line BB-BB in FIG. 4C.

FIG. 4C shows the IC module 30b of FIGS. 4A to 4B being worked upon to establish electrical connection to an antenna coil 37 which is incorporated in a card body. Other features and characteristics of the IC module 30b, method of establishing electrical connection with antenna coil 37 and method of implanting the IC module 30b, as illustrated by FIGS. 4A to 4D, would be similar to the foregoing description in relation to FIGS. 3A to 3G, 10 and 11, and therefore their details will not be reproduced here. A smart card implanted with the IC module 30b of FIGS. 4A to 4B would be similar to the foregoing description in relation to FIGS. 3A to 3G, and therefore its details will not be reproduced here.

Figure 5A:
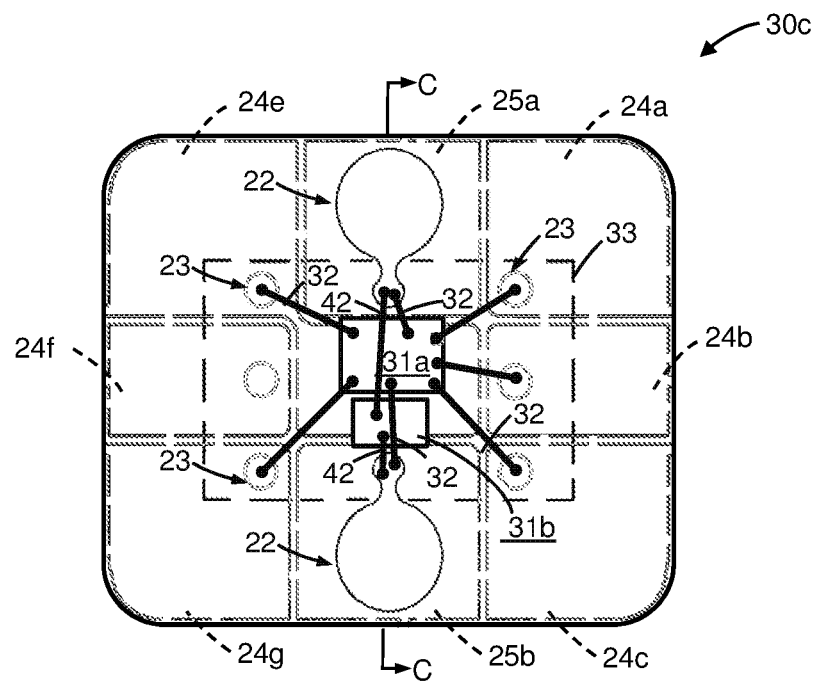
FIG. 5A shows a see-through view which is taken from a bonding side of an IC module having an IC connector with six ISO designated contacts according to another embodiment of the invention, wherein the footprints of the contact pads and the encapsulation are in dashed lines.
Figure 5B:
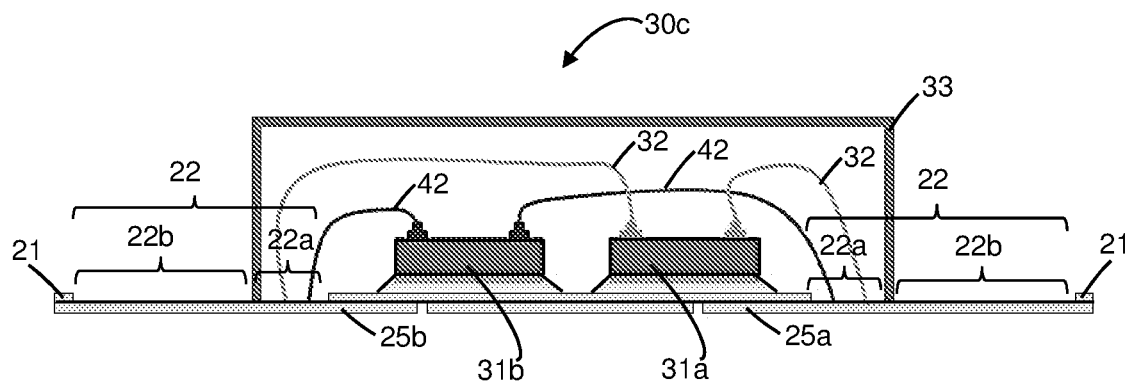
FIG. 5B is a cross-sectional view of the IC module taken along line C-C in FIG. 5A.

FIG. 5A shows a see-through view which is taken from a bonding side of an IC module 30c according to yet another embodiment of the invention, wherein the footprints of the contact pads and the encapsulation are in dashed lines. FIG. 5B is a cross-sectional view of the IC module taken along line C-C in FIG. 5A. In this embodiment, the IC module 30c comprises a first IC chip 31a and a second IC chip 31b arranged on the second side of the substrate 21. A plurality of first conductive elements 32 traverse at least some of the single-bond holes 23 and multi-bond holes 22, and electrically connect at least some of the contact pads, including module-side antenna contact pads 25a, 25b, to on-chip pads of the first IC chip 31a. A plurality of second conductive elements 42 respectively traverse the pair of multi-bond holes and, electrically connect the module-side antenna contact pads 25a, 25b to the second IC chip 31b. Second conductive elements 42 may further electrically connect the second IC chip 31b to other contact pads (not shown). Those first and second conductive elements 32, 42, which traverse the first aperture 22a of the multi-bond holes, are encapsulated by an encapsulant 33. Similar to the embodiment of FIGS. 3A to 3G, the encapsulant 33 is deposited on a portion of the contact pad 25a/25b to define a first bonding area 241. The encapsulation seals the first bonding area 241 and prevents access thereto. The encapsulation also defines a first bonding channel 221 terminating at the first bonding area 241. A second bonding area 242 on the module-side antenna contact pad 25a/25b, being adjoining and electrically connected to the first bonding area 241, is not deposited with the encapsulant 33 and therefore remains accessible through a second bonding channel 222 terminating at the second bonding area 242, e.g. through the second aperture 22b of the multi-bond hole 22. This second bonding area 241, being devoid of encapsulation, is accordingly accessible or exposed through the multi-bond hole 22 as a surface for establishing electrical connection to the appropriate one of the first and the second IC chip 31a, 31b.

Figure 5C:
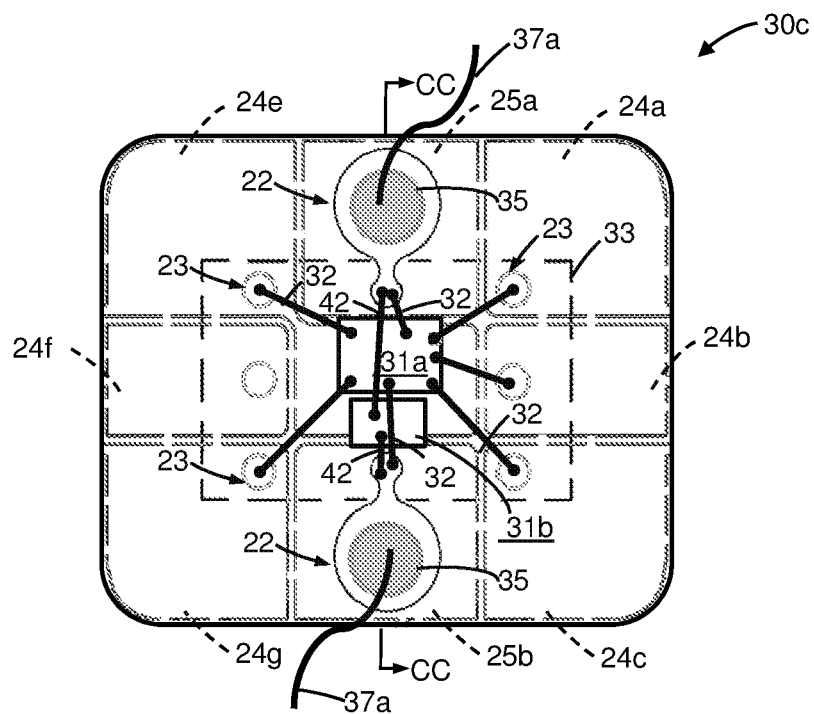
FIG. 5C shows the IC module of FIGS. 5A to 5B being worked upon to establish electrical connection to an antenna coil which is incorporated in a card body.
Figure 5D:
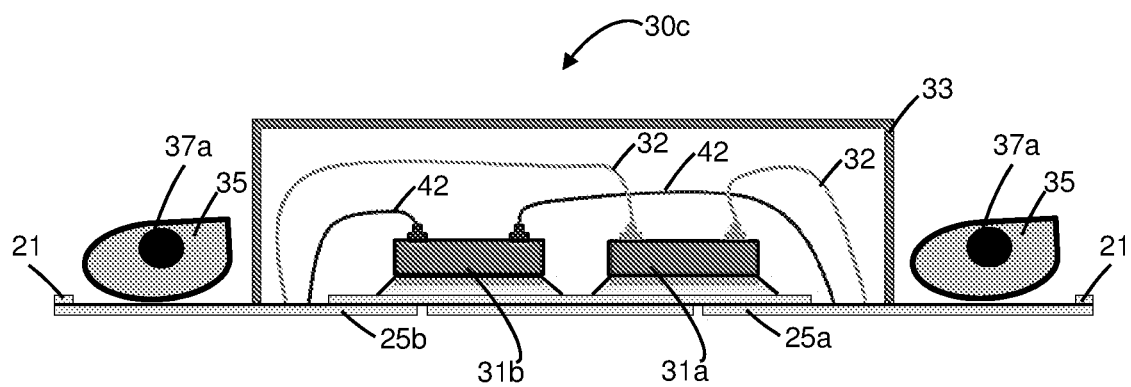
FIG. 5D is a cross-sectional view of the IC module taken along line CC-CC in FIG. 5C.

FIG. 5C shows the IC module 30c of FIGS. 5A to 5B being worked upon to establish electrical connection to an antenna coil 37 which is incorporated in a card body. Other features and characteristics of the IC module 30c, method of establishing electrical connection with antenna coil 37 and method of implanting the IC module 30c, as illustrated by FIGS. 5A to 5D, would be similar to the foregoing description in relation to FIGS. 3A to 3G, 10 and 11, and therefore their details will not be reproduced here. A smart card implanted with the IC module 30c of FIGS. 5A to 5B would be similar to the foregoing description in relation to FIGS. 3A to 3G, and therefore its details will not be reproduced here.

FIG. 6A shows a top view which is taken from a contact side of a module carrier tape segment 60 having a plurality of conductive contact pads, e.g. IC connector having eight ISO designated contact pads. FIG. 6B shows a bottom view which is taken from a bonding side of the module tape segment 60 of FIG. 6A having a plurality of holes according to one embodiment of the invention. FIG. 6C is a see-through view of FIG. 6B, wherein the footprints of the contact pads and the encapsulation are in dashed lines.

Referring to the embodiment illustrated in FIGS. 6A to 6C, the conductive pads include a first pair of contact pads, which may be hereinafter referred to as "module-side antenna contact pads" 25a, 25b, and contact pads 24a, 24b, 24c, 24d, 24e, 24f, 24g, 24h. Among these contact pads are at least two distinct or mutually exclusive pairs of contact pads, e.g. (24a, 24e) and (24d, 24h). The module-side antenna contact pads 25a, 25b are respectively juxtaposed between the two mutually exclusive pairs of contact pads, i.e. 25a is juxtaposed between 24a and 24e while 25b is juxtaposed between 24d and 24h. Module-side antenna contact pad 25b may be further juxtaposed between 24c and 24g.

In certain examples, the contact pads other than the module-side antenna contact pads, i.e. eight ISO designated contact pads C1 to C8 respectively corresponding to 24a to 24h, may be arranged along first opposed edge portions, e.g. opposed width edges, of the substrate 21 at locations which are ISO designated contact locations. The module-side antenna contact pads 25a, 25b and the two mutually exclusive pairs of contact pads (24a, 24e) and (24d, 24h) are arranged along second opposed edge portions, e.g. opposed length edges, of the substrate 21. The two mutually exclusive pairs of contact pads (24a, 24e) and (24d, 24h) may be arranged at locations which are ISO-designated contact locations, however, the module-side antenna contact pads 25a, 25b are located at non-ISO designated contact locations. The pair of first opposed edge portions and the pair of second opposed edge portions are generally mutually transverse. If the substrate 21 has a generally rectangular or square shape, the two mutually exclusive pairs of contact pads (24a, 24e) and (24d, 24h) may be, but not necessarily, arranged at corner or near-corner portions of the substrate 21 and non-overlapping with C4 and C8 contact pads.

It is to be appreciated that the module-side antenna contact pads 25a, 25b are non-overlapping with ISO designated locations of C1 to C8 contact pads on an IC connector, e.g. 24a to 24h. In other words, the module-side antenna contact pads 25a, 25b are arranged at locations on an IC connector, which are undesignated or unspecified by existing ISO or industry standards whether for current use or reserved for future use. In other words, the module-side antenna contact pads 25a, 25b are non-overlapping with contact pads designated by ISO 7816 as reserved for future use, e.g. C4 and C8 contact pads.

Other features and characteristics of the IC connector, as illustrated by FIGS. 6A to 6C, would be similar to the foregoing description in relation to FIGS. 2A to 2C, and therefore its details will not be reproduced here.

Figure 7A:
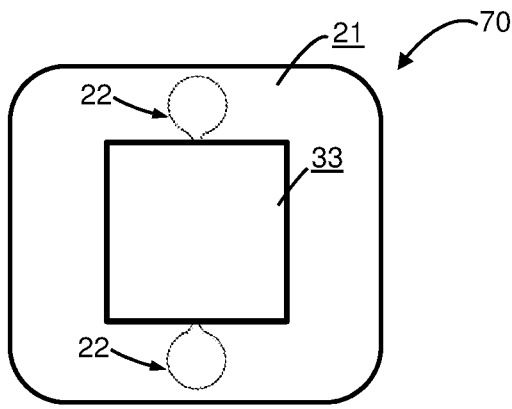
FIG. 7A shows a bottom view which is taken from a bonding side of an IC module having an IC connector with eight ISO designated contacts according to one embodiment of the invention.
Figure 7B:
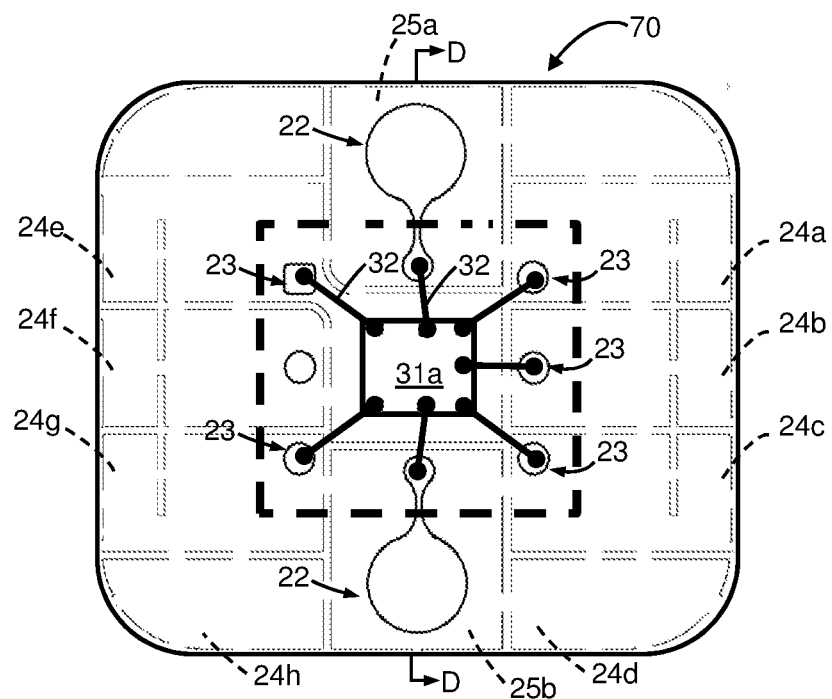
FIG. 7B is a see-through view of FIG. 7A, wherein the footprints of the contact pads and the encapsulation are in dashed lines.
Figure 7C:
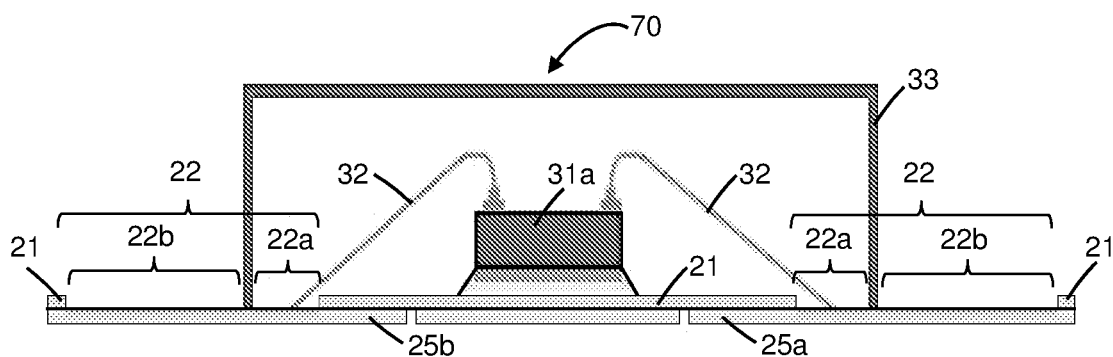
FIG. 7C is a cross-sectional view of the IC module taken along line D-D in FIG. 7B.

FIG. 7A shows a bottom view which is taken from a bonding side of an IC module 70 according to one embodiment of the invention. FIG. 7B is a see-through view of FIG. 7A, wherein the footprints of the contact pads and the encapsulation are in dashed lines. FIG. 7C is a cross-sectional view of the IC module 70 taken along line D-D in FIG. 7B. Apart from provision of C4 and C8 contact pads 24d, 24h and locations of the module-side antenna contact pads 25a, 25b relative to C4 and C8 contact pads, which have been described in relation to FIGS. 6A to 6C, other features and characteristics of the IC module 70, method of establishing electrical connection with antenna coil 37 and method of implanting the IC module 70 would be similar to the foregoing description in relation to FIGS. 3A to 3G, 10 and 11, and therefore their details will not be reproduced here. A smart card implanted with the IC module 70 would be similar to the foregoing description in relation to FIGS. 3A to 3G, and therefore its details will not be reproduced here.

It is to be appreciated that the IC module 70 of FIG. 7A to 7C may be modified to provide other embodiments. For example, an IC module 70 may have multiple first conductive elements 32 traversing the multi-bond holes 25a, 25b, which is similar to the foregoing description in relation to FIGS. 4A to 4D, and therefore its details will not be reproduced here. In another example, an IC module 70 may have multiple IC chips being separately connected to the module-side antenna contact pads 25a, 25b, which is similar to the foregoing description related to FIGS. 5A to 5D and therefore its details will not be reproduced here.

In relation to the configuration and/or arrangement of multi-bond holes 22, the first and the second aperture 22a, 22b may have different shapes and/or unequal dimensions, e.g. width, length. For example, in embodiments as shown in FIGS. 2B to 2C, 3B to 6C, 7B, the first and the second aperture are located at an opposed relation to the first and the second bonding area respectively, wherein the first aperture includes a width which is constricted relative to a width/diameter of the second aperture. Such configuration of multi-bond holes may be varied as follows. In one embodiment, the first aperture of at least one of the first pair of multi-bond holes includes a length which is greater than or equal to a distance between two of the single-bond holes which are formed in adjacent or non-adjacent ones of the contact pads. In one embodiment, the first aperture of at least one of the first pair of multi-bond holes is arranged between the first IC chip (or an area on the second side of the substrate which is adapted for arranging the first IC chip) and at least one single-bond hole. In one embodiment, the first aperture of the at least one of the first pair of multi-bond holes is at least partially arranged in conformity with a contour defined by at least one of the sides of the first IC chip (or of the area on the second side of the substrate which is adapted for arranging the first IC chip). In one embodiment, a third aperture, fluidly connecting between the first and the second aperture, includes a width which is constricted relative to the width of the first aperture and the width of the second aperture. In some embodiments, the above-described variations may be selectively combined. In some embodiments, both the multi-bond holes may have similar configuration and/or arrangement while in some other embodiments, the multi-bond holes may have dissimilar or distinct configuration and/or arrangement.

Figure 8A:
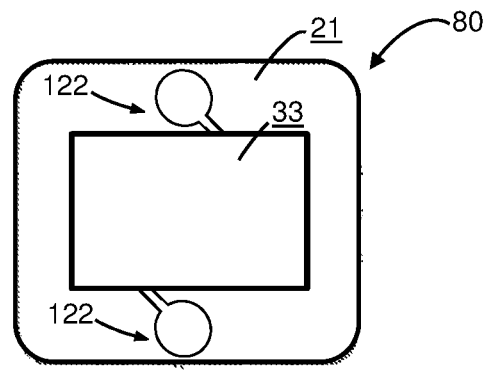
FIG. 8A shows a bottom view which is taken from a bonding side of an IC module having an IC connector with six ISO designated contacts according to one embodiment of the invention.
Figure 8B:
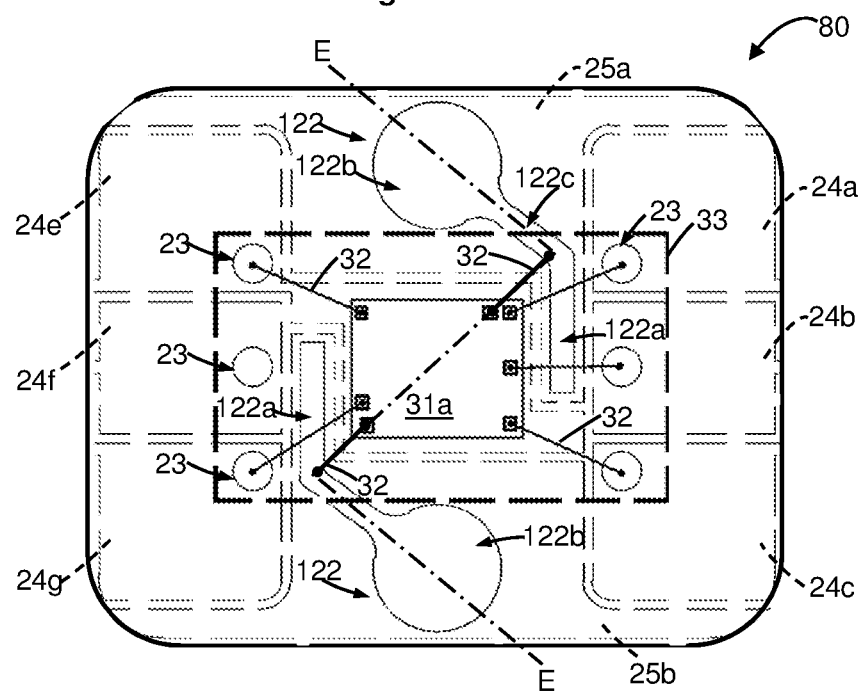
FIG. 8B is a see-through view of FIG. 8A, wherein the footprints of the contact pads and the encapsulation are in dashed lines.
Figure 8C:
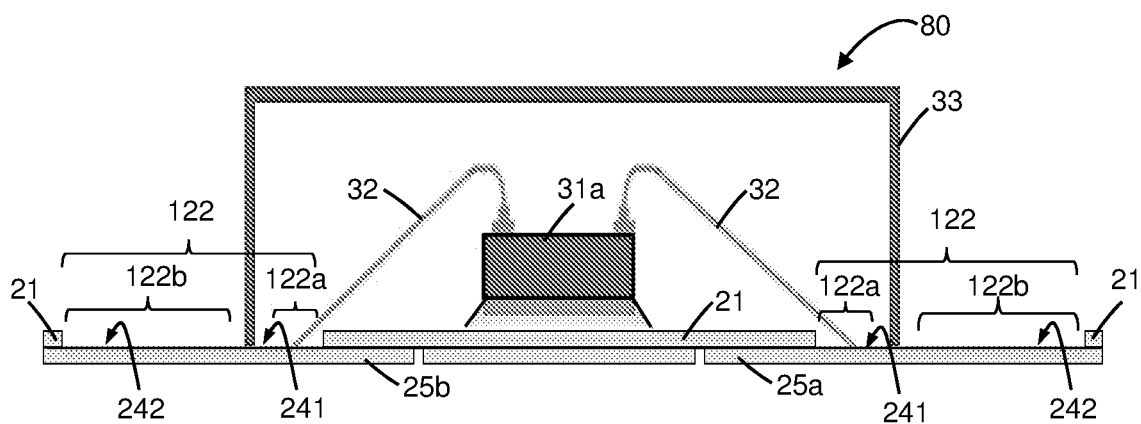
FIG. 8C is a cross-sectional view of the IC module taken along zig-zag line E-E in FIG. 8B.

FIG. 8A shows a bottom view which is taken from a bonding side of an IC module 80 according to one embodiment of the invention. FIG. 8B is a see-through view of FIG. 8A, wherein the footprints of the contact pads and the encapsulation are in dashed lines. FIG. 8C is a cross-sectional view of the IC module 80 taken along zig-zag line E-E in FIG. 8B. FIG. 9A shows a bottom view which is taken from a bonding side of an IC module 90 according to one embodiment of the invention. FIG. 9B is a see-through view of FIG. 9A, wherein the footprints of the contact pads and the encapsulation are in dashed lines. FIG. 9C is a cross-sectional view of the IC module 90 taken along line F-F in FIG. 9B. Apart from the configuration and/or arrangement of multi-bond holes, features and characteristics of the IC module 80, 90, method of establishing electrical connection with antenna coil 37 and method of implanting the IC module 80, 90 would be similar to the foregoing description in relation to FIGS. 3A to 3G, 10 and 11, and therefore their details will not be reproduced here. A smart card implanted with the IC module 80, 90 would be similar to the foregoing description in relation to FIGS. 3A to 3G, and therefore its details will not be reproduced here.

In relation to the configuration and/or arrangement of multi-bond holes 122 formed in module-side antenna contact pad 25a/25b of FIGS. 8A to 8C and 9A to 9C, each multi-bond hole 122 may be formed of a plurality of interconnected apertures, e.g. a first aperture 122a and a second aperture 122b fluidly connected to each other. A diameter/width of the second aperture 122b may be greater than a diameter/width of the first aperture 122a, e.g. by at least two times. The interconnection between the first aperture 122a and the second aperture 122b may optionally be referred to as a third aperture 122c. The third aperture 122c may be constricted relative to the second aperture 122b (see FIGS. 8A to 8C, 9A to 9C) or to both the first and the second aperture 122a, 122b (not shown).

The first aperture 122a is generally elongated, e.g. its length is greater in relation to its width. At least part of the first aperture 122a is arranged or interposed between the first IC chip 31a and at least one single-bond hole 23. The first aperture 122a, or part thereof, may have an aperture length which traverses the substrate 21 at least partially along a side of the first IC chip 31a. The first IC chip 31a has a plurality of sides which may be generally non-parallel, e.g. orthogonal, to the substrate 21. In embodiments of FIGS. 8B and 9B, the aperture length traversing at least partially along a side of the first IC chip 31a may be greater than or equal to a distance between two adjacent single-bond holes formed in adjacent contact pads. This aperture length and this distance between two adjacent single-bond holes 23 may be taken along a surface of the substrate 21 on which the single-bond holes 23 and multi-bond holes 22 are arranged or formed. In embodiments of FIGS. 8B and 9B, the first aperture 122, or part thereof, is at least partially arranged in conformity with a contour defined by one or more sides of the first IC chip. For example, in FIG. 8B, the first aperture 122a, or part thereof, is parallel to one side of the first IC chip 31a. For example, in FIG. 9B, the first aperture 122a, or part thereof, is provided as mutually-orthogonal aperture paths or sections, e.g. L-shape, and is parallel to two adjoining sides, e.g. orthogonal sides, of the first IC chip 31a.

Although each first aperture 122a or part thereof, as illustrated FIGS. 8B and 9B, defines one or more straight/linear paths or sections, it is to be appreciated that each first aperture 122a or part thereof may define a curve/non-linear path or section. Each second aperture 122b may be circular or formed of polygon and/or irregular shape. Each third aperture 122c, if any, may define a straight/linear or curve/non-linear path.

In smart cards according to one embodiment of the invention, an antenna-connecting element, i.e. an electrical connection between the module-side antenna contact pad 25a/25b and antenna coil 37 embedded in the card body, is provided by a conductive bump 35. It is to be appreciated that the antenna-connecting element may be provided by other conductive means in other embodiments. Such antenna-connecting element may be a conductive disc which is an elastomeric material comprising conductive particles, or a flexible conductive bump which may be dispensed as an electrically conductive adhesive, e.g. in paste form, and curable into a rigid form. The conductive disc or flexible conductive bump may be deposited on the card-side antenna contact pad before curing and/or before implanting the IC module onto the card body. In one embodiment, the exposed terminals 37a are extracted portions of an embedded antenna coil 37. It is to be appreciated that in other embodiments, instead of extracting terminals 37a of the antenna coil 37 from the card body, a card-side antenna contact pad (not shown) may be arranged in the module cavity of the card body and is electrically connected to the embedded antenna coil 37. An antenna-connecting element may be interposed and/or abutted between the module-side antenna contact pad and the card-side antenna pad to establish an electrical connection therebetween.

A method for fabricating an integrated module for a dual interface smart card is described as follows.

A workpiece is provided, wherein the workpiece comprises a non-conductive substrate having a plurality of single-bond holes and a pair of multi-bond holes, both extending through a first and a second side of the substrate, a plurality of conductive contact pads, including a first pair thereof, arranged over the holes and on the first side of the substrate, a first and/or second IC chips arranged on the second side of the substrate, and a plurality of first and/or second conductive elements traversing the holes and electrically connecting the contact pads to the first and/or second IC chips. A first pair of first conductive elements respectively traverse the pair of multi-bond holes and electrically connect the first pair of contact pads to the first IC chip.

The workpiece is subject to an encapsulation process to encapsulate the IC chip(s) and conductive element(s), and to define a first and a second bonding area on the module-side antenna contact pad as well as a first and a second bonding channel.

(i) In a dam and fill encapsulation process, a dam is deposited on the internal side of a module-side antenna contact pad to define a perimeter for encapsulation before depositing an encapsulant within the dam perimeter. Particularly at the multi-bond hole, a dam material may be deposited into the constricted third aperture or first aperture, thereafter an encapsulant is deposited into the first aperture having one or more conductive elements, and the encapsulant is cured to produce an encapsulation filling the first aperture.

(ii) Alternatively, in an encapsulation process without use of dam material, an encapsulant is deposited into the first aperture of a multi-bond hole, having one or more conductive elements, and cured. The constricted third aperture in some embodiments, being more narrow than the first and the second aperture, or the constricted first aperture in some other embodiments, being more narrow than the second aperture, may prevent the encapsulant from egress or flowing into the second aperture.

Regardless of choice of encapsulation process, the encapsulant is deposited over the IC chip(s) and the conductive elements in the single-bond holes, and fills the single-bond holes. The encapsulant is also deposited into a multi-bond hole such that a first aperture of the multi-bond hole is filled with encapsulation which defines a first bonding channel and seals the first bonding area, while conductive element(s) in the first bonding channel are encapsulated. Any constricted third aperture connected to the first aperture may also be filled or partially filled as appropriate. The second aperture of a multi-bond hole is unfilled or at most partially filled with encapsulation such that a second bonding channel provides access to a second bonding area on the module-side antenna contact pad to allow electrical connection thereto. The partitioning of the first and the second bonding area and channel is performed by deposition of encapsulation on the module side antenna contact pad 25a/25b and without arranging or interposing a substrate between the first and the second bonding area and channel.

Notwithstanding the shape and/or arrangement of the multi-bond holes employed in embodiments of the invention, which may not have been illustrated in the accompanying Figures, it is to be appreciated that the extent of the first and the second bonding area on the module-side antenna contact pad may be determined by the encapsulation process. For example, the dam material defines a perimeter of the first bonding area such that the remaining area on the module-side antenna contact pad, which is outside the dam perimeter, is defined as the second bonding area. Using the accompanying drawings to illustrate, the dam material may be deposited into the first aperture 22a/122a or constricted third aperture 22c/122c of a multi-bond hole 22 and the encapsulant is dispensed into the first aperture to define a first bonding area which is sized approximate to the first aperture. However, this may be varied in other examples in which, the dam material may be deposited into the second aperture 22b/122b of a multi-bond hole 22 and the encapsulant is dispensed into the first aperture 22a/122a to define a first bonding area which is larger than the first aperture. It is to be appreciated that in other embodiments, wherein the multi-bond hole may take on other shapes and/or arrangement, notwithstanding a presence or absence of a constricted region interconnecting the aperture(s) opening into the multi-bond hole, the dam material may determine a perimeter of the encapsulation region prior to dispensing an encapsulant within the perimeter of the dam material, to thereby apportion or partition a first and a second bonding area within the multi-bond hole.

Embodiments of the invention provide several advantages including but not limited to the following:

The invention obviates the need for double side plating of conductive contact pads in an IC module for dual interface smart card having a single IC chip for implementing both contact and contactless interfaces, or hybrid smart card having multiple, e.g. two, IC chips which separately implement contact and contactless interfaces and are not interconnected, or an ICC or smart card having multiple, e.g. two or more, IC chips. In the invention, a substrate has conductive contact pads arranged on a first side of the substrate but is devoid of conductive contact pad arranged on a second side of the substrate, wherein the first and the second side are in opposed relation. Accordingly, the invention provides a single-side plated IC module and a smart card incorporated the same, wherein a contact side of the IC module is plated with conductive contact pads while a bonding side of the IC module is devoid of conductive contact pads.

The invention allows two or more IC chips to be connected to a single location or same conductive contact pad, e.g. module-side antenna contact pad. FIGS. 5A to 5D show two IC chips electrically connected to module-side antenna contact pads through the multi-bond holes.

The invention provides a larger non-encapsulated substrate area on its bonding side, which results in larger adhesion area and improved adhesion with the card body. Multi-bond holes of the invention allow multiple conductive elements and types thereof, e.g. wire bonds and antenna-connecting element, to be accommodated therein and electrically connected to the same contact pad. By combining bonding holes and thereby reducing the number of bonding holes, lesser substrate area is needed for maintaining hole-to-hole distance prescribed by industry standards. This translates into a larger substrate area on the bonding side thereof, which is suitable for application of adhesive, and is useful if the overall footprint area of contact pads is to be further reduced. For example, IC modules with six contact pads or pin-outs normally suffer from unsatisfactory adhesion to card body, as compared to IC modules with eight contact pads or pin-outs, due to smaller substrate area for adhering to card body. Adhesion of such IC modules will be improved with the invention.

By terminating the encapsulation or arranging an edge of thereof on the module side antenna contact pads 25a/25b to define a boundary of the first and the second bonding area and of the first and the second bonding channel, the invention allows flexibility in apportioning or determining the extent of the first and the second bonding area on the internal side of the module-side antenna contact pad. Deposition of encapsulant on each module-side antenna contact pad defines a first and a second bonding channel within the same multi-bond hole for respectively receiving different types of conductive elements, e.g. wire bonds and antenna-connecting elements. The encapsulant or an edge thereof also apportions or partitions the electrically conductive module-side antenna contact pad into a first and a second bonding area without requiring presence of substrate separating the two bonding areas or channels, and therefore reduces an overall footprint requirement of the contact pads relative to the dimensions of the IC connector.

The invention is therefore distinct over US 2017/0270398 A1 (hereinafter '398 publication). In various examples of the '398 publication, the edge of its encapsulation area terminates at the electrically insulating substrate in accordance with common industry practice. FIG. 4 of the '398 publication shows that a circle corresponding to the encapsulation area of the chip and its connection wires leaves the oblong holes free so that they can subsequently be connected to an antenna. FIGS. 5 to 7 then show various ways in which a conductive land is connected to an antenna through the oblong hole. The example of FIG. 5 shows two wire connections established in the oblong hole which is devoid of encapsulation—however, this example may result in crossing of the two wires, which would lead to electrical shorting and/or breakage of the two wires. In the examples of FIGS. 6 and 7, a portion of insulating substrate is used to create two separate holes (a round connection well and an oblong blind hole)—however, these examples may experience increased difficulty in applying adhesion to bonding side of the chip card module and reduce adhesion area on the bonding side/adhesion capability thereof.

The invention utilises non-ISO designated space on external contact side, e.g. IC connector, of an IC module for locating the module-side antenna contact pads 25a, 25b. For a six-pin type IC connector having ISO designated C1 to C3 and C5 to C7 contact pads, module-side antenna contact pad 25a is located between C1 and C5 contact pads while module-side antenna contact pad 25b is located between C3 and C7 contact pads. For an eight-pin type IC connector having ISO designated C1 to C8 contact pads, module-side antenna contact pad 25a is located between C1 and C5 contact pads while module-side antenna contact pad 25b is located between C4 and C8 contact pads, possibly as well as between C3 and C7 contact pads. Accordingly, the module-side antenna contact pads 25a, 26b are each physically separate or distinct from ISO designated contact pad locations for C1 to C8; they are also non-overlapping with (or electrically isolated from) ISO designated contact pad locations for C1 to C8; they are located in a non-ISO designated space which will be free of electrical contact with a contact-based card reader when the IC module, after implantation onto a card body, is inserted therein. It will be appreciated by persons skilled in the art that dimensions and locations of C1 to C8 contact pads on an IC connector, as well as the relative location of the IC connector on a card body, e.g. ID-1 size, are defined by ISO 7816 and/or other equivalent industry standards, and will not be reproduced here. However, FIG. 1B shows a schematic representation of the relative arrangement of contact pad locations defined by ISO 7816.

The invention is distinct over U.S. Pat. No. 9,390,365 B2 which teaches utilization of unused contact pads C4 and C8 as antenna contact pads for a dual-interface smart card, and which is expected to cause operational problems with the smart card. Certain contact-based card readers, e.g. Point of Sale (POS) terminal, Automated Teller Machine (ATM) and personalisation equipment used by bureau service and banks, employ reader contact pins which would read from C4 and C8 contact pads, as well as from C1 to C3, C5 to C7 contact pads, even though C4 and C8 are unused pads. If ISO designated C4 and C8 pads are utilised as antenna contact pads to implement contactless interface, this is expected to cause signal interference when such IC module is read by contact-based card readers. Such signal interface to the IC chip would result in malfunction or non-function of the IC chip.

The invention, particularly the embodiments of FIGS. 8A-8C and 9A-9C, provides a single-side plated IC carrier tape with greater compatibility with various types of IC chips. By providing a length of the first aperture 122a of a multi-bond hole 122 greater than or equal to a distance between two adjacent single-bond holes formed in adjacent contact pads, by locating the first aperture 122a between the IC chip and at least one single-bond hole, and/or by arranging the first aperture 122a in conformity with at least one contour of the sides of the IC chip, wire bonds 32 from the IC chip may be connected to the module-side antenna contact pads 25a, 25b at any one of a variety of locations provided by the first aperture 122a. Accordingly, such IC carrier tape is compatible with a variety of IC chips regardless of the position of an on-chip pad thereon which is to be electrically connected to the module-side antenna contact pad.

The invention, particularly the modified method of FIG. 11, allows the step of establishing electrical connection between antenna coil and module-side antenna contact pads and the step of implanting an IC module onto a card body to be combined into a single step. Accordingly, this obviates the need for an equipment for electrically connecting antenna coil and module-side antenna contact pads prior to implanting the IC module onto a card body, and furthermore, this obviates potential breakage of the electrical connection between antenna coil and module-side antenna contact pads when the IC module is subsequently implanted in a separate step.

The ICC or smart cards according to the invention may be used in various applications, including but not limited to, commercial or financial applications, e.g. banking, credit/debit card, stored value, electronic cash, loyalty system, identification, ticketing, parking and toll collection; mobile telecommunications; and information technology, e.g. access control, secured authentication.

It is to be understood that the embodiments and features described above should be considered exemplary and not restrictive. Many other embodiments will be apparent to those skilled in the art from consideration of the specification and practice of the invention. Furthermore, certain terminology has been used for the purposes of descriptive clarity, and not to limit the disclosed embodiments of the invention.

The invention claimed is:

1. An integrated circuit (IC) module for a smart card with both contact and contactless interfaces, the IC module comprising:
   a non-conductive substrate having a plurality of single-bond holes and a pair of multi-bond holes, both extending from a first to a second side of the substrate;
   a plurality of conductive contact pads, including a first pair thereof, arranged on the first side of the substrate;
   a first IC chip arranged on the second side of the substrate;
   a plurality of first conductive elements traversing the single-bond and the pair of multi-bond holes, and electrically connecting at least some of the contact pads to the first IC chip, wherein the first conductive elements include a first pair of first conductive elements respectively traversing the pair of multi-bond holes and electrically connecting the first pair of contact pads to the first IC chip; and
   an encapsulant deposited on the first IC chip, the first conductive elements and the first pair of contact pads, wherein an edge of the encapsulant deposited on the first pair of contact pads apportions each of the pair of multi-bond holes into an encapsulated first bonding channel and an adjoining unencapsulated second bonding channel respectively terminating at a first and an adjoining second bonding area on each of the first pair of contact pads such that the first pair of first conductive elements respectively traverse the first bonding channel of the pair of multi-bond holes and further such that the encapsulant seals the first bonding area and exposes the second bonding area through the second bonding channel to provide a surface for establishing electrical connection to the first IC chip, wherein the edge of the encapsulant partitions the first and the second bonding area from each other without requiring a presence of the substrate therebetween.

2. The IC module of claim 1, wherein the first conductive elements include a second pair of first conductive elements, and wherein the encapsulant is further deposited on the second pair of first conductive elements respectively traversing the first bonding channel of the pair of multi-bond holes and electrically connecting the first pair of contact pads to the first IC chip.

3. The IC module of claim 1, further comprising:
   a second IC chip arranged on the second side of the substrate; and
   a pair of second conductive elements respectively traversing the first bonding channel of the pair of multi-bond holes and electrically connecting the first pair of the contact pads to the second IC chip, wherein the encapsulant is further deposited on the pair of second conductive elements.

4. The IC module of claim 1, wherein the second bonding area is at least two times larger than the first bonding area.

5. The IC module of claim 1, wherein the contact pads include two mutually exclusive pairs of contact pads being other than the first pair of contact pads, and wherein the first pair of contact pads are respectively juxtaposed between the two mutually exclusive pairs of contact pads.

6. The IC module of claim 5, wherein the contact pads other than the first pair of contact pads are arranged along first opposed edge portions of the substrate, wherein the first pair of contact pads and the two mutually exclusive pairs of contact pads are arranged along second opposed edge portions of the substrate, wherein the first and the second opposed edge portions are mutually transverse.

7. The IC module of claim 1, wherein the first pair of contact pads are non-overlapping with the contact pads other than the first pair of contact pads.

8. The IC module of claim 7, wherein the first pair of contact pads are non-overlapping with contact pads designated by ISO 7816 as reserved for future use.

9. The IC module of claim 1, wherein each of the pair of multi-bond holes is formed of at least a first and a second aperture fluidly connected to each other and located at an opposed relation to the first and the second bonding area respectively, wherein the first aperture includes a width which is constricted relative to a width of the second aperture.

10. The IC module of claim 9, wherein the first aperture of at least one of the pair of multi-bond holes includes a length which is greater than or equal to a distance between two of the single-bond holes which are formed in adjacent ones of the contact pads.

11. The IC module of claim 9, wherein the first aperture of the at least one of the pair of multi-bond holes is arranged between the first IC chip and at least one single-bond hole.

12. The IC module of claim 9, wherein the first IC chip includes a plurality of sides, wherein the first aperture of the at least one of the pair of multi-bond holes is at least partially arranged in conformity with a contour defined by at least one of the sides of the first IC chip.

13. The IC module of claim 9, wherein a third aperture, fluidly connecting between the first and the second aperture, includes a width which is constricted relative to the width of the first aperture and the width of the second aperture.

14. The IC module of claim 1, wherein each of the pair of multi-bond holes is formed of two partially overlapping circular apertures.

15. A smart card with both contact and contactless interfaces, the smart card comprising:
   a card body having a module cavity and an antenna coil;
   a pair of antenna-connecting elements;
   an integrated circuit (IC) module disposed in the cavity, the IC module comprising:
   a non-conductive substrate having a plurality of single-bond holes and a pair of multi-bond holes, both extending from a first to a second side of the substrate;
   a plurality of conductive contact pads, including a first pair thereof, arranged on the first side of the substrate;
   a first IC chip arranged on the second side of the substrate;
   a plurality of first conductive elements traversing the single-bond and the pair of multi-bond holes, and electrically connecting at least some of the contact pads to the first IC chip, wherein the first conductive elements include a first pair of first conductive elements respectively traversing the pair of multi-bond holes and electrically connecting the first pair of contact pads to the first IC chip; and an encapsulant deposited on the first IC chip, the first conductive elements and the first pair of contact pads, wherein an edge of the encapsulant deposited on the first pair of contact pads apportions each of the pair of multi-bond holes into an encapsulated first bonding channel and an adjoining unencapsulated second bonding channel respectively terminating at a first and an adjoining second bonding area on each of the first pair of contact pads such that the first pair of first conductive elements respectively traverse the first bonding channel of the pair of multi-bond holes and further such that the encapsulant seals the first bonding area, wherein at the second bonding channel, one of the pair of the antenna-connecting elements traverses the second bonding channel and connects between the antenna coil and the second bonding area such that electrical connection between the antenna coil and the first IC chip is established, wherein the edge of the encapsulant partitions the first and the second bonding area from each other without requiring a presence of the substrate therebetween.

16. The smart card of claim 15, wherein the first conductive elements include a second pair of first conductive elements, and wherein the encapsulant is further deposited on the second pair of first conductive elements respectively traversing the first bonding channel of the pair of multi-bond holes and electrically connecting the first pair of contact pads to the first IC chip.

17. The smart card of claim 15, further comprising:
a second IC chip arranged on the second side of the substrate; and
a pair of second conductive elements respectively traversing the first bonding channel of the pair of multi-bond holes and electrically connecting the first pair of the contact pads to the second IC chip, wherein the encapsulant is further deposited on the pair of second conductive elements.

18. The smart card of claim 15, wherein the antenna-connecting element includes a rigid conductive or solder bump, a conductive disc, or a flexible conductive bump comprising an electrically conductive adhesive.

19. The smart card of claim 15, wherein the second bonding area is at least two times larger than the first bonding area.

20. The smart card of claim 15, wherein the contact pads include two mutually exclusive pairs of contact pads being other than the first pair of contact pads, and wherein the first pair of contact pads are respectively juxtaposed between the two mutually exclusive pairs of contact pads.

21. The smart card of claim 20, wherein the contact pads other than the first pair of contact pads are arranged along first opposed edge portions of the substrate, wherein the first pair of contact pads and the two mutually exclusive pairs of contact pads are arranged along second opposed edge portions of the substrate, wherein the first and the second opposed edge portions are mutually transverse.

22. The smart card of claim 15, wherein the first pair of contact pads are non-overlapping with the contact pads other than the first pair of contact pads.

23. The smart card of claim 22, wherein the first pair of contact pads are non-overlapping with contact pads designated by ISO 7816 as reserved for future use.

24. The smart card of claim 15, wherein each of the pair of multi-bond holes is formed of at least a first and a second aperture fluidly connected to each other and located at an opposed relation to the first and the second bonding area respectively, wherein the first aperture includes a width which is constricted relative to a width of the second aperture.

25. The smart card of claim 24, wherein the first aperture of at least one of the pair of multi-bond holes includes a length which is greater than or equal to a distance between two of the single-bond holes which are formed in adjacent ones of the contact pads.

26. The smart card of claim 24, wherein the first aperture of the at least one of the pair of multi-bond holes is arranged between the first IC chip and at least one single-bond hole.

27. The smart card of claim 24, wherein the first IC chip includes a plurality of sides, wherein the first aperture of the at least one of the pair of multi-bond holes is at least partially arranged in conformity with a contour defined by at least one of the sides of the first IC chip.

28. The smart card of claim 24, wherein a third aperture, fluidly connecting between the first and the second aperture, includes a width which is constricted relative to the width of the first aperture and the width of the second aperture.

29. The smart card of claim 15, wherein each of the pair of multi-bond holes is formed of two partially overlapping circular apertures.

30. A method of fabricating an integrated circuit (IC) module for smart card with both contact and contactless interfaces, the method comprising:
having a non-conductive substrate having a plurality of single-bond holes and a pair of multi-bond holes, both extending from a first to a second side of the substrate, a plurality of conductive contact pads, including a first pair thereof, arranged on the first side of the substrate, a first IC chip arranged on the second side of the substrate, and a plurality of first conductive elements traversing the single-bond and the pair of multi-bond holes, and electrically connecting at least some of the contact pads to the first IC chip, wherein the first conductive elements include a first pair of first conductive elements respectively traversing the pair of multi-bond holes and electrically connecting the first pair of contact pads to the first IC chip; and
depositing an encapsulant on the first IC chip, the first conductive elements and the first pair of contact pads, including
apportioning, by an edge of the encapsulant, each of the pair of multi-bond holes into an encapsulated first bonding channel and an adjoining unencapsulated second bonding channel respectively terminating at a first and an adjoining second bonding area on each of the first pair of contact pads, wherein the first pair of first conductive elements respectively traverse the first bonding channel of the pair of multi-bond holes,
without requiring the substrate between the first and the second bonding area, partitioning, by the edge of the encapsulant, the first bonding area from the second bonding area by sealing the first bonding area with the encapsulant to define the first bonding channel and expose the second bonding area through the second bonding channel to provide a surface for establishing electrical connection to the first IC chip.

31. The method of claim 30, wherein depositing the encapsulant on the first IC chip, the first conductive elements and the first pair of contact pads further includes depositing the encapsulant on a second pair of first conductive elements which respectively traverse the first bonding channel of the pair of multi-bond holes and electrically connect the first pair of contact pads to the first IC chip.

32. The method of claim 30, wherein the substrate includes a second IC chip arranged on the second side of the substrate, and wherein depositing the encapsulant on the first IC chip, the first conductive elements and the first pair of contact pads further includes depositing the encapsulant on the second IC chip and a pair of second conductive elements which respectively traverse the first bonding channel of the pair of multi-bond holes and electrically connect the first pair of contact pads to the second IC chip.

33. The method of claim 30, wherein each of the pair of multi-bond holes is formed of a first and a second aperture fluidly connected by a third aperture therebetween, wherein depositing the encapsulant on the first IC chip, the first conductive elements and the first pair of contact pads further includes dispensing the encapsulant through the first aperture and allowing the third aperture, which is constricted relative to at least the second aperture, prevent the encapsulant from flowing into the second aperture.

34. The method of claim 30, wherein before depositing the encapsulant on the first IC chip, the first conductive elements and the first pair of contact pads, the method further comprises:

depositing a dam material on each of the first pair of contact pads to define a perimeter of the first bonding area, and wherein depositing the encapsulant on the first IC chip, the first conductive elements and the first pair of contact pads further includes depositing the encapsulant within the perimeter to seal the first bonding area.

35. A method of fabricating a smart card with both contact and contactless interfaces, the method comprising:

having a card body having a module cavity and an antenna coil;

having the IC module of claim 1;

using an antenna-connecting element which traverses the second bonding channel within each of the pair of multi-bond holes, electrically connecting one of the first pair of contact pads, via the second bonding area thereof, to the antenna coil;

applying an adhesive to the second side of the substrate; and implanting the IC module onto the card body with the second side of the substrate facing the module cavity of the card body.

36. The method of claim 35, wherein using the antenna-connecting element which traverses the second bonding channel within each of the pair of multi-bond holes, electrically connecting one of the first pair of contact pads, via the second bonding area thereof, to the antenna coil, further includes:

depositing the antenna-connecting element being a conductive paste on the second bonding area; and applying heat to the conductive paste to bond to the second bonding area and an exposed terminal of the antenna coil.

37. The method of claim 35, wherein using the antenna-connecting element which traverses the second bonding channel within each of the pair of multi-bond holes, electrically connecting one of the first pair of contact pads, via the second bonding area thereof, to the antenna coil, further includes:

depositing the antenna-connecting element on a card-side antenna contact pad provided on the card body, wherein the card-side antenna contact pad is electrically connected to the antenna coil.

38. The method of claim 35, wherein the antenna-connecting element includes a rigid conductive or solder bump, a conductive disc, or a flexible conductive bump comprising an electrically conductive adhesive.

39. A method of fabricating a smart card with both contact and contactless interfaces, the method comprising:

having a card body having a module cavity and an antenna coil;

having the IC module of claim 1;

depositing an antenna-connecting element on the second bonding area of each of the first pair of contact pads;

melting and bonding the antenna-connecting element to the second bonding area;

applying an adhesive to the second side of the substrate;

disposing the IC module in the module cavity of the card body with the second side of the substrate facing the module cavity of the card body and disposing the antenna-connecting element into proximity of the antenna coil; and concurrently applying heat and pressure to the card body and the IC module, including:

using the applied heat, melting the antenna-connecting element and thereby electrically connecting the antenna-connecting element to the antenna coil, and activating the adhesive; and using the applied pressure and activated adhesive, bonding the IC module to the card body.

40. The method of claim 39, wherein the antenna-connecting element includes a conductive paste or ribbon.

41. A single-side plated integrated circuit (IC) carrier tape adapted for use in smart card with both contact and contactless interfaces, the IC carrier tape comprising:

a non-conductive substrate having a plurality of single-bond holes and a pair of multi-bond holes, both extending from a first to a second side of the substrate;

a plurality of conductive contact pads, including a first pair thereof, arranged on the first side of the substrate;

wherein the second side of the substrate is adapted to be arranged with a first IC chip thereon;

wherein at least some of the contact pads are adapted to electrically connect to the first IC chip through a plurality of first conductive elements traversing the single-bond and the pair of multi-bond holes, wherein the first pair of contact pads are adapted to electrically connect to the first IC chip through a first pair of the first conductive elements traversing the pair of multi-bond holes; and wherein each multi-bond hole is adapted to be apportioned, by an edge of an encapsulant to be deposited on the first pair of contact pads, into an encapsulated first bonding channel and an adjoining unencapsulated second bonding channel respectively terminating at a first and an adjoining second bonding area on each of the first pair of contact pads such that the first pair of first conductive elements are adapted to respectively traverse the first bonding channel of the pair of multi-bond holes and further such that the encapsulant is adapted to seal the first bonding area and expose the second bonding area through the second bonding channel to provide a surface for establishing electrical connection to the first IC chip, wherein the first and the second bonding area are adapted to be partitioned from each other, by the edge of the encapsulant, without requiring a presence of the substrate therebetween.

42. The IC carrier tape of claim 41, wherein the contact pads include two mutually exclusive pairs of contact pads being other than the first pair of contact pads, and wherein the first pair of contact pads are respectively juxtaposed between the two mutually exclusive pairs of contact pads.

43. The IC carrier tape of claim 42, wherein the contact pads other than the first pair of contact pads are arranged along first opposed edge portions of the substrate, wherein the first pair of contact pads and the two mutually exclusive pairs of contact pads are arranged along second opposed edge portions of the substrate, wherein the first and the second opposed edge portions are mutually transverse.

44. The IC carrier tape of claim 41, wherein the first pair of contact pads are non-overlapping with the contact pads other than the first pair of contact pads.

45. The IC carrier tape of claim 44, wherein the first pair of contact pads are non-overlapping with contact pads designated by ISO 7816 as reserved for future use.

46. The IC carrier tape of claim 41, wherein each of the pair of multi-bond holes is formed of at least a first and a second aperture fluidly connected to each other and located at an opposed relation to the first and the second bonding area respectively, wherein the first aperture includes a width which is constricted relative to a width of the second aperture.

47. The IC carrier tape of claim 46, wherein the first aperture of at least one of the pair of multi-bond holes includes a length which is greater than or equal to a distance between two of the single-bond holes which are formed in adjacent ones of the contact pads.

48. The IC carrier tape of claim 46, wherein the first aperture of the at least one of the pair of multi-bond holes is arranged between an area on the second side of the substrate adapted for arranging the first IC chip and at least one single-bond hole.

49. The IC carrier tape of claim 46, wherein the first aperture of the at least one of the pair of multi-bond holes is at least partially arranged in conformity with a contour defined by at least one side of the area adapted for arranging the first IC chip.

50. The IC carrier tape of claim 46, wherein a third aperture, fluidly connecting between the first and the second aperture, includes a width which is constricted relative to the width of the first aperture and the width of the second aperture.

51. The IC carrier tape of claim 41, wherein each of the pair of multi-bond holes is formed of two partially overlapping circular apertures.

* * * * *